United States Patent [19]

Ono et al.

[11] Patent Number: 5,045,971
[45] Date of Patent: Sep. 3, 1991

[54] ELECTRONIC DEVICE HOUSING WITH TEMPERATURE MANAGEMENT FUNCTIONS

[75] Inventors: Hideyo Ono; Kunitoshi Yoshitake; Nobuyuki Kakuta, all of Hyogo, Japan

[73] Assignee: Mitsubishi Denki Kabushiki Kaisha, Tokyo, Japan

[21] Appl. No.: 376,041

[22] Filed: Jul. 6, 1989

[30] Foreign Application Priority Data

Apr. 18, 1989 [JP] Japan .................................. 1-96480

[51] Int. Cl.⁵ .............................................. H05K 9/00
[52] U.S. Cl. .................................... 361/386; 361/388; 361/389; 361/424
[58] Field of Search .......... 174/35 R, 35 MC, 35 GC, 174/52.3; 361/383, 384, 386, 387, 388, 389, 390, 393, 394, 399, 412, 415, 424; 220/378

[56] References Cited

U.S. PATENT DOCUMENTS 4,004,194 1/1977 Doerslinger et al. ............... 361/389
4,249,033 2/1981 Darakjy et al. ..................... 361/384

FOREIGN PATENT DOCUMENTS 58-164289 11/1983 Japan .
58-164292 11/1983 Japan .
62-23495 2/1987 Japan .
62-78798 5/1987 Japan .
63-59398 4/1988 Japan .

Primary Examiner—Leo P. Picard
Assistant Examiner—Donald A. Sparks

[57] ABSTRACT

The electronic device housing employs unique temperature management functions. Thermally sensitive electronic components are thermally isolated from the environment and from temperature generating components provided within the housing through the use of an insulative case material. Furthermore, heat generating components are connected to the outside environment with a conductive thermal path which is isolated from the remaining components provided within the case, thereby efficiently transferring undesired heat to the environment without allowing the heat to substantially affect remaining components in the housing. The electronic device housing includes a case and a cover formed by molding using a synthetic resin, and a metallic layer formed on the surface of the case which cooperates with the cover to provide an electromagnetic shield for the case. Further, a waterproof seal is provided in the abutment between the case and the cover and the heat radiating effect of the case is enhanced by a heat radiation plate provided outside the case and connected to any heat generating components. The electronic device of such construction is easy to machine, light in weight and inexpensive.

78 Claims, 26 Drawing Sheets

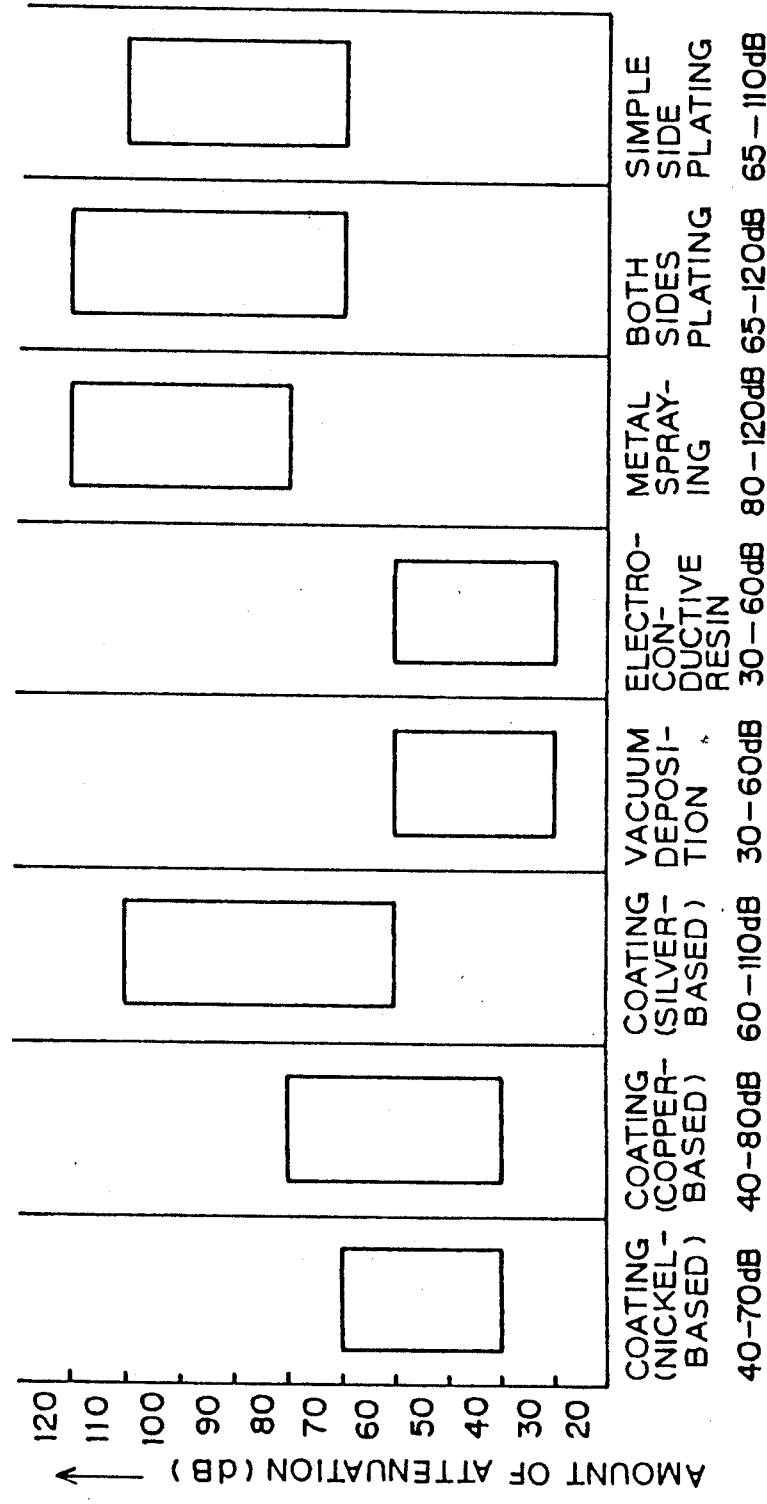

ELECTRONIC DEVICE HOUSING WITH TEMPERATURE MANAGEMENT FUNCTIONS

FIELD OF THE INVENTION

The present invention relates to an electronic device housing and more particularly to an electronic device housing formed of a synthetic resin performing improved temperature management functions and useable for housing a mobile communication device.

BACKGROUND OF THE INVENTION

The housing of an electronic device, particularly of a mobile communication device, must resist vibrations and impacts and exhibit a shielding effect against external, electromagnetic wave energy disturbances as well as internal, electromagnetic energy. Further, the housing of an electronic device containing a heat-generating component must radiate the generated heat efficiently. Although not heretofore known, it is also desirable for such a housing to insulate sensitive components from severe temperature variations. In case of a portable electronic device, its housing must also be small in size and weight. And the housing of an electronic device which is likely to be used in the rain, is required to be rainproof.

In the interior of the housing of a mobile communication device it has been considered necessary to support or fix modules into the housing with bolts or the like and to provide a partition to prevent electromagnetic interference between circuits.

FIGS. 18(a–d) show a prior art housing of such a mobile communication device. FIG. 18(a) is a plan view, FIG. 18(b) is a front view, FIG. 18(c) is a left side view, and FIG. 18(d) is a right side view of the prior art device. In FIGS. 18(a) to 18(d), the reference numeral 1 generally denotes a transceiver contained in an electronic device housing comprising a cover 101 and a case 107, the housing containing a radio apparatus and a logic controller. A coaxial connector 2 for the connection with an external antenna is attached to a side face of the transceiver housing.

The transceiver 1 is provided with a handset connector (not shown) which extends through a handset connector housing opening 3 for use together with a handset (also not shown). The transceiver is also provided with an external microphone connector (not shown) which extends through an external microphone housing opening 4 and a power cable connector (not shown) which extends through a power cable connector opening 5 for the supply of power from a vehicular battery. The transceiver case 107 is further provided with support legs 6a–6d at four corners of the bottom 107b thereof. Square recesses 7a–7d for mounting the case to a mounting bracket 8 are formed between the bottom 107b and the support legs 6a–6d.

A mounting bracket 8 is provided for mounting the transceiver 1 to a vehicle or the like. The mounting bracket 8 has pawls or tabs 9a–9d at four corners thereof provided so as to be fittably received in the square recesses 7a–7d provided on the case 107. The mounting bracket 8 is further provided with a release lever 10 at an end thereof. When the transceiver 1 is slid on the mounting bracket 8 until the pawls or tabs 9a–9d of the mounting bracket 8 are fitted in the square recesses 7a–7d of the case 107, a lock receptacle 11 on the bottom 107b of the transceiver case 107 and the front end of the release lever 10 come into engagement with each other to lock the transceiver 1 to the mounting bracket 8.

For removing (unlocking) the transceiver 1 from the mounting bracket 8, the release lever 10 is shifted laterally to disengage the front end of the release lever 10 from the lock receptacle 11 to effect unlocking. In the bottom of the mounting bracket 8 are formed mounting holes 8a–8d for fixing the bracket 8 to the body of a vehicle or the like with bolts fitted through the mounting holes 8a–8d.

Numeral 12 denotes a rail which is formed of nylon or the like to provide a relatively frictionless slidable engagement between the mounting bracket 8 and the transceiver for good slippage at the time of mounting of the transceiver 1. The rail 12 is attached to the mounting bracket 8 by press-fitting a concave portion of the channel shaped rail 12 onto the upper edge of a side plate 8sp of the bracket. The bottom of the housing 107 of the transceiver 1 is provided with a guide 13 arranged in engageable relationship with the rail 12 to facilitate the mounting and support of the transceiver 1 to the bracket 8.

FIG. 19 is an exploded perspective view of the conventional transceiver 1 shown in FIG. 18. In FIG. 19, the numeral 101 denotes a cover; number 102 denotes a conductive shield ring comprising, for example, a rubber ring with a metallic mesh disposed therearound; and numerals 103a to 103c denote a logic (LCU) module, a receiver/synthesizer module and a transmitter (TX) module, respectively.

On the receiver/synthesizer module 103b is mounted a TCXO (Temperature Compensated Crystal Oscillator) 104 which ensures frequency stability of the synthesizer, and the transmitter module 103c has a transmission power amplifier 105 and an isolator 106 mounted thereon.

Numeral 107 denotes the case, to which is attached the antenna connector 2 with a screw 2c through a water-proof rubber 2a and a metallic mounting piece 2b. Numeral 108 denotes an O-ring made of rubber for waterproofing.

Conventional examples related to the electronic device housing comprising the cover 101 and the case 107 are mentioned in Japanese Utility Model Laid-Open Nos. 164289/83, 164292/83, 23495/87 and 78798/87.

The cover 101 is formed by die casting of aluminum. Its surface has been subjected to a dewaxing treatment for removing oil and fat adhered thereto at the time of a secondary machining such as punching for the die cast, a coating treatment for preventing oxidation and an outer surface coating treatment for covering the texture of aluminum.

FIG. 20(a) is a view corresponding to both the section taken on line C—C of the cover 101 and the case 107; FIG. 20(b) is an enlarged sectional view illustrating the abutment between the cover 101 and the case 107; and FIG. 20(c) is an enlarged sectional view of an abutment between the logic module 103a and a projection 101c of the cover 101.

In FIGS. 20(a) to 20(c), a recess 101a for the shield ring 102 is formed in the peripheral edge of the cover 101 on the side in juxtaposition with the case 107. Like the cover 101, the case 107 is also formed by die casting of aluminum and the surface thereof has been subjected to the aforementioned treatments.

The portion of the case 107 opposed to the recess 101a is formed as a convex projection 107a. A recess 107b for the O-ring 108, which uses the convex 107a as part of the side wall thereof, is formed in the case 107. Therefore, when the cover 101 is attached to the case 107, the shield ring 102 fitted in the recess 101a of the cover 101 comes into contact with the convex 107a of the case 107, so the open portion of the case 107 is completely electromagnetically closed by the shield ring 102 and cover 101, resulting in the protection of the internal circuitry against external, electromagnetic wave energy disturbances. Undesired electromagnetic energy generated from the internal circuitry is also prevented from leaking to the exterior of the transceiver 1, thereby preventing disturbance to other electronic devices.

Likewise, the O-ring 108 fitted in the recess 107b of the case 107 comes into pressure contact with a convex 101b of the cover upon closing of the cover 101, so that the transceiver 1 is sealed hermetically. Consequently, even when the transceiver 1 is exposed to water drops such as rain, the drops are prevented from entering the interior, so the internal circuitry is protected.

In FIG. 19, the transmitter module 103c is mounted to a transmitter module receiving portion 107c of the case 107 using bolts, while the transmission power amplifier 105 and the isolator 106 are mounted to the case 107 directly or through a good heat conductor 109 (FIG. 20a).

The peripheral surface of the case 107 is formed with heat radiation fins 107g (FIG. 19) to radiate the heat generated from the transmission power amplifier 105, isolator 106, etc. during the operation of the transmitter. This is accomplished efficiently through use of the aluminum die-cast case 107 (a good heat conductor) and the heat radiation fins 107g. A shield plate (not shown) is provided over the transmitter module 103c and is attached to the case 107 to prevent electromagnetic interference with other circuit blocks.

The receiver/synthesizer module 103b is fixed to a base plate receiving portion 107d of the case, for example with bolts. The module is electromagnetically shielded by a partition 107e of the case 107 to prevent electromagnetic interference from the transmitter circuit from being received in the module receiving portion 107c. This shielding is accomplished by means of a partition 107e of the case 107. On the bottom of the case 107 is formed a low partition 107f which contacts the back of the receiver/synthesizer module 103b, thereby preventing electromagnetic interference between the receiver portion and the synthesizer portion.

Over the transmitter module 103c thus received in the case and the shield plate mounted thereover, the logic module 103a is attached to the case 107, with its component mounting side facing down. Attachment to the case 107 is made bolts for example securing it to the partition 107e. A multiple contact connector 110 is provided to allow opposed connection with another module, e.g. the receiver/synthesizer module 103b.

As shown in FIG. 20(c), the cover 101 is provided with the projection 101c which has a recess 101d, for abutment with the logic module 103a when the cover is attached to the case 107. A shield ring 102a is fitted in the recess 101d. Before the cover 101 is closed, the shield ring 102a is provided in the recess 101d. Upon closing of the cover, the shield ring 102a comes into contact with the logic module 103a and a rubbery core thereof is deflected and comes into pressure contact with the cover 101 and the logic module 103a, thus permitting electromagnetic shielding between circuits in the logic module 103a.

As described above, the conventional electronic device housing is formed of the aluminum die-cast cover and case, so in comparison with other conventional housings formed of a metal such as iron or brass, it is strong, highly resistant to external impacts and vibrations, exhibits a satisfactory heat radiation effect, and can be molded integrally as compared with a housing constituted by a combination of sheet metals, allowing formation of partitions in the inside of the housing to easily reduce electromagnetic interference between modules and also between intramodule circuits. Use of this material facilitates construction of a water resistant housing having electromagnetic shielding effects. Thus, such a housing exhibits excellent performance and functions.

However, although the aluminum material is lighter than many other metals, it is heavier than other diverse structural materials, and for integral molding, it is necessary that an injection molding be performed at high temperature and pressure by aluminum die casting. Therefore, it is difficult to adopt a complicated die structure, and in order to obtain a fine structure it is necessary to use a lot of dies, including side-core dies. The finer the structure, the easier the breakage of the die, and because of a high temperature and high pressure injection molding and hence a great temperature difference from ordinary temperature (room temperature), the die is apt to break after only a short service life.

Consequently, it is desirable to reduce the number of shots (the number of products capable of being produced from a single die), and since burr is formed on the aluminum die cast surface, it is absolutely necessary to perform a secondary machining such as forming a tapped hole for the removal of the burr. And because an oily machine is used for the secondary machining, a dewaxing treatment is required to remove the oil and fat adhered to the surface. To cover the metal texture of aluminum it is necessary to apply, for example, coating thereto.

Moreover, as compared with other diverse structural materials, aluminum is high in cost per unit volume and requires much time for the above secondary machining, surface treatment, etc., and there is a limit in the reduction of cost.

Perhaps even more importantly, although aluminum is metal and it is a good heat conductor, conducting the heat from heat-generating components to the exterior in a satisfactory manner, it also conducts external temperature variations to the interior of the housing. Further, aluminum cannot insulate sensitive components from normal temperature fluctuations and thus sensitive components must be designed for a greater operating temperature range. Additionally, the heat conducted from heat generating components in the housing to other components contained therein increases the temperature variations even further. Thus, additional heat is transmitted to, for example, the TCXO on the receiver/synthesizer module; and the TCXO must therefore have a design temperature range which is the working outside air temperature range plus the temperature rise caused by such transmission of the heat. This leads to increased cost as components capable of withstanding high temperatures are required or results in shortening the operating life of components.

SUMMARY OF THE INVENTION

It is an object of the present invention to provide an electronic device housing which is easy to machine, light in weight and inexpensive.

It is another object of the present invention to provide an electronic device housing capable of providing an electromagnetic shielding effect and a water resistant effect.

It is a further object of the present invention to provide an electronic device housing having a mechanical strength which is superior and a heat radiation effect.

It is a further object to provide a housing which thermally isolates temperature sensitive components from environmental temperature changes as well as temperature changes caused by adjacently disposed heat generating components.

It is a still further object to provide a housing which efficiently conducts heat only from the heat generating components contained thereon directly to the housing exterior.

In order to achieve the above mentioned objects, the electronic device housing of the present invention includes a case formed by molding of a synthetic resin and having rounded corner portions of a size which permits continuous formation of a metallic layer without a break at a substantially uniform thickness; a cover attached to an opening portion of the case so as to come into contact with the said metallic layer formed on the surface of the case, to effect electromagnetic shielding for the interior of the case; a waterproofing means provided on the abutment between the case and the cover; and a heat radiation plate attached to the outside of the case and thermally connected only to desired heat generating components contained therein.

Also, in the above construction, a heat radiation member is provided to radiate the internal heat of desired components in the case to the exterior efficiently.

Further a partition wall is integrally formed in the interior of the case to effect heat insulation and electromagnetic shielding between the spaces partitioned by the partition wall.

BRIEF DESCRIPTION OF THE DRAWINGS

FIG. 4 is a graph illustrating the known attenuation performance resultant from various electromagnetic shielding treatments as is known in the art of shielding generally;

DETAILED DESCRIPTION OF THE PREFERRED EMBODIMENTS

Preferred embodiments of the present invention will be described in detail hereunder with reference to the accompanying drawings.

Figure 1:
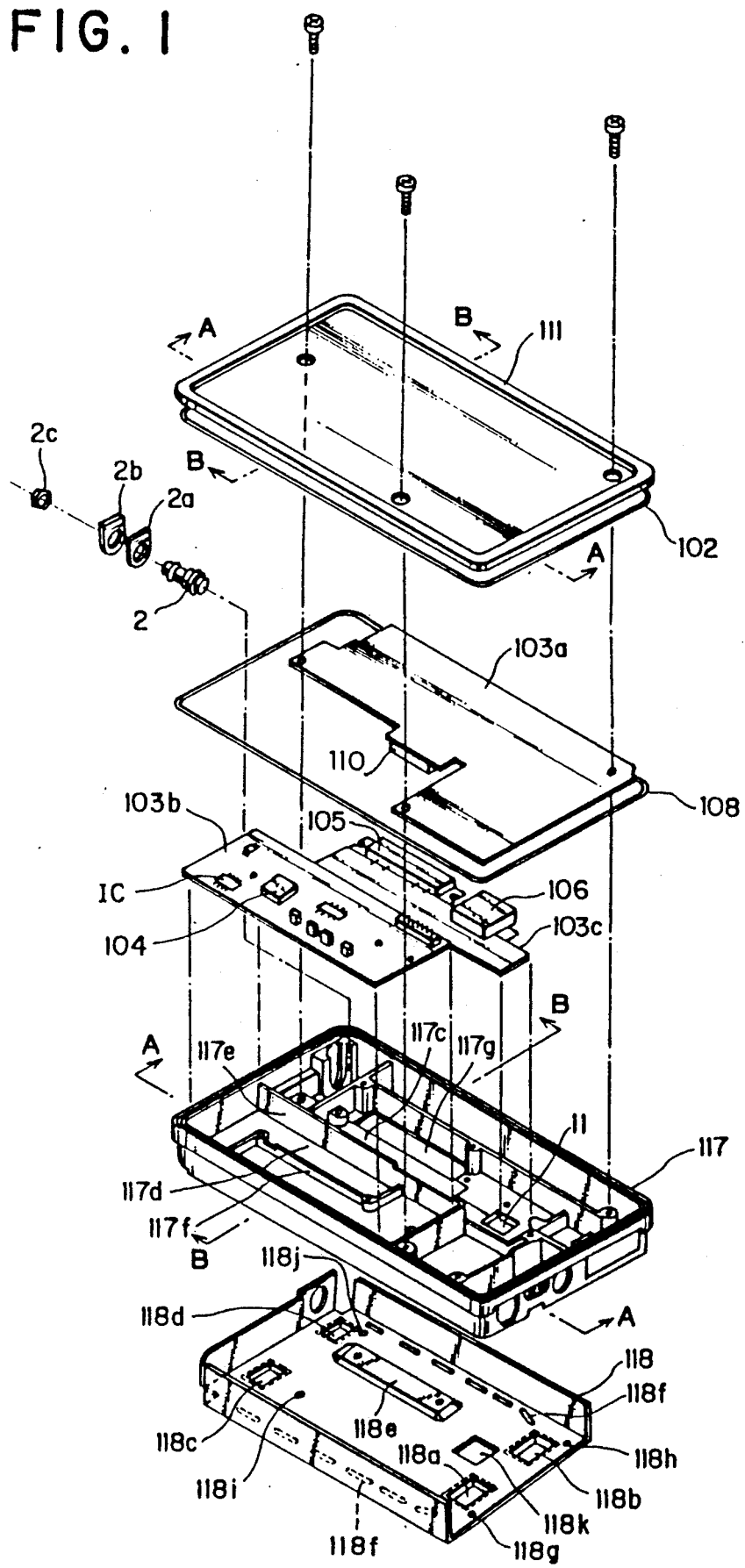
FIG. 1 is an exploded perspective view of an electronic device housing according to an embodiment of the present invention.
Figure 19:
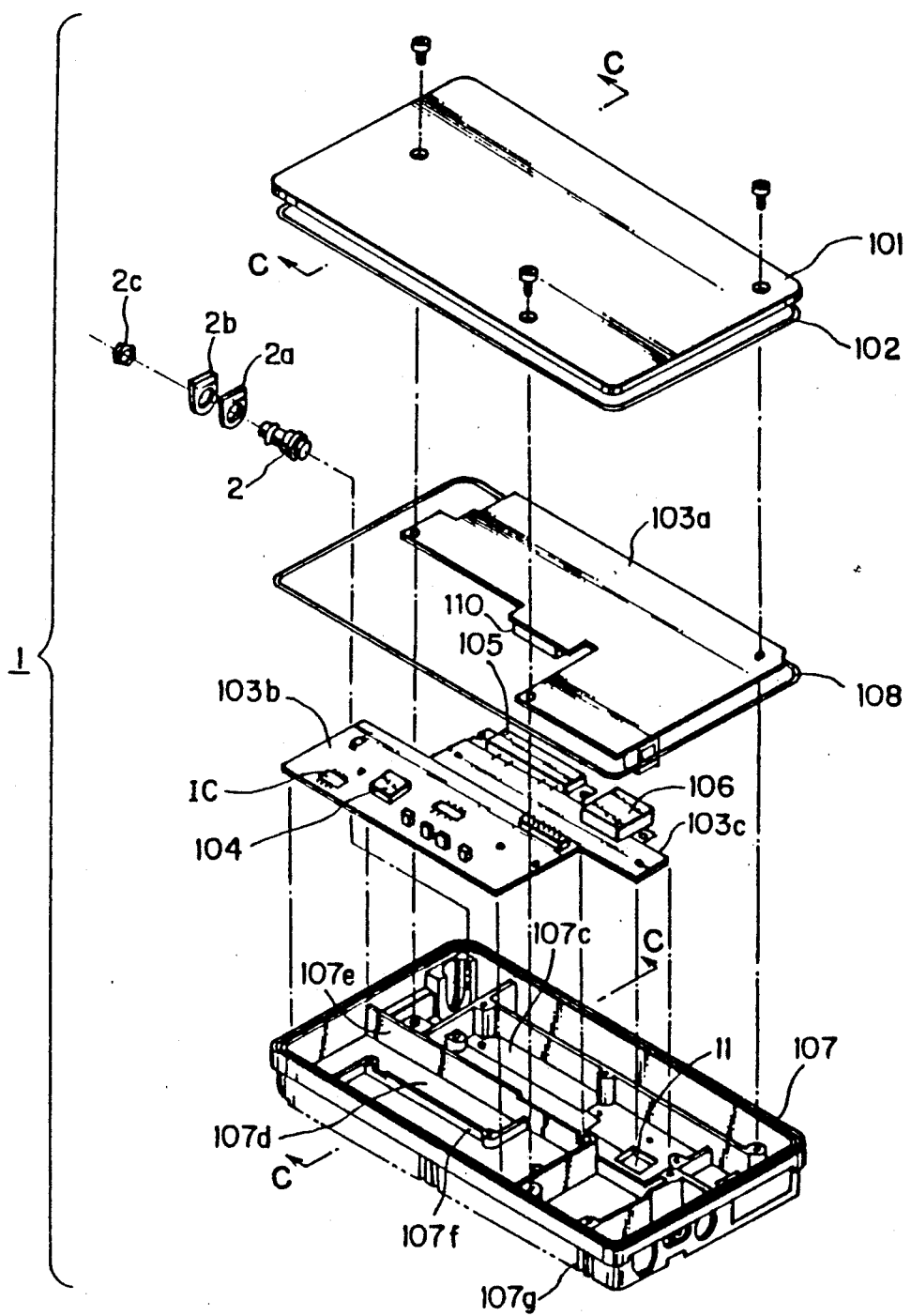
FIG. 19 is an exploded perspective view of the conventional electronic device housing.

In FIG. 1 in which the same portions as in FIG. 19 are indicated by the same reference numerals, the numeral 111 denotes a synthetic resin cover; numeral 117 denotes a synthetic resin case; and numeral 118 denotes a heat radiation plate formed of aluminum for example and attached to the underside of the case 117 to radiate the heat generated from heat-generating components.

Figure 2A:
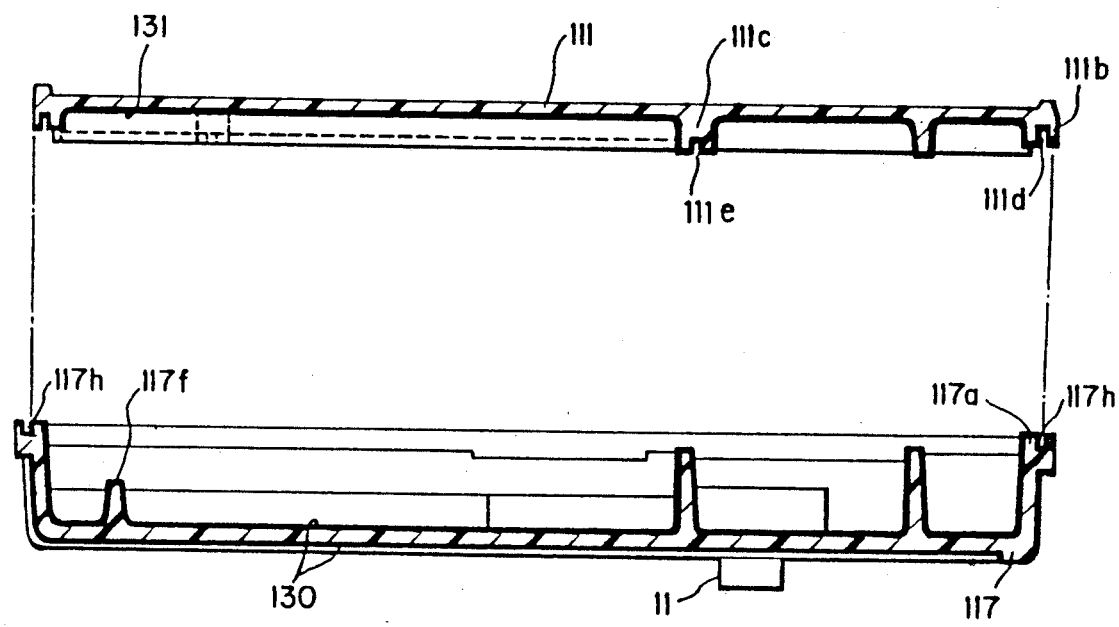
FIG. 2(a) is a longitudinal sectional view taken along line A—A of FIG. 1.
Figure 2B:
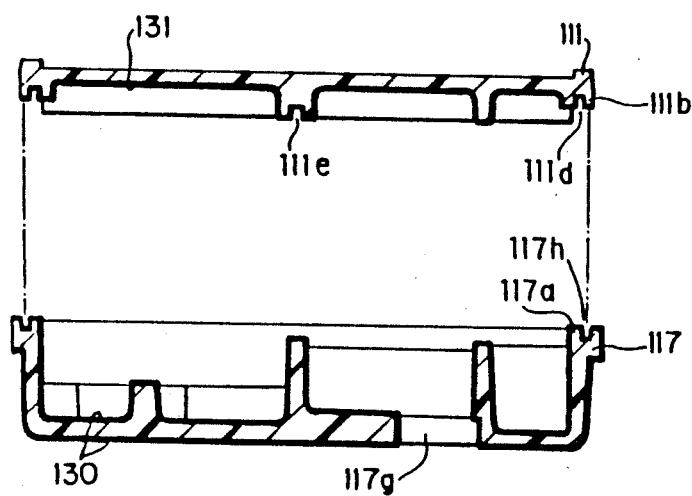
FIG. 2(b) is a transverse sectional view taken along line B—B of FIG. 1.
Figure 3A:
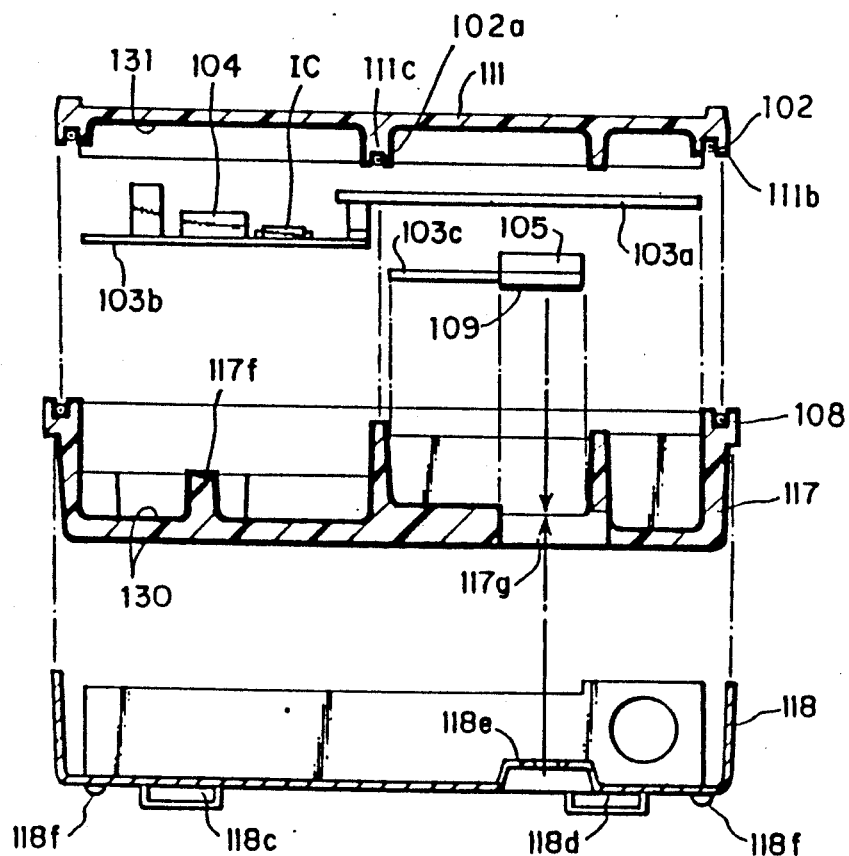
FIG. 3(a) is a transverse sectional view of a cover, a case and a heat radiation plate as separated from one another.
Figure 3B:
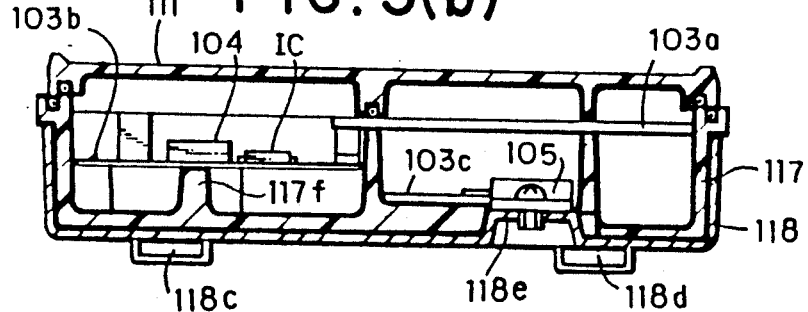
FIG. 3(b) is a transverse sectional view of an assembled state thereof.
Figure 3C:
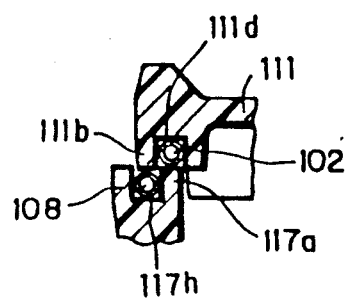
FIG. 3(c) is an enlarged sectional view of an abutment between the cover and the case.
Figure 3D:
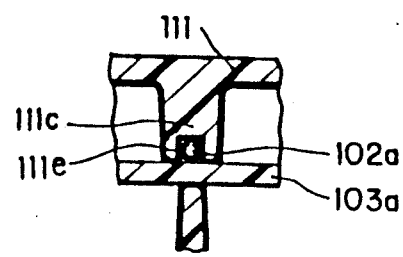
FIG. 3(d) is an enlarged sectional view of an abutment between a logic module and a projection of the case.

FIG. 2(a) is an enlarged longitudinal sectional view of the cover 111 and the case 117 taken along line A—A in FIG. 1; FIG. 2(b) is an enlarged transverse sectional view taken along line B—B in FIG. 1; FIG. 3(a) is a transverse sectional view taken along line B—B in FIG. 1, showing a relation between the cover 111 and the case 117 as well as the heat radiation plate 118; FIG. 3(b) is a transverse sectional view of an assembled state thereof; FIG. 3(c) is an enlarged sectional view of an abutment between the cover 111 and the case 117; and FIG. 3(d) is an enlarged sectional view of an abutment between a projection 111c of the cover 111 and a logic module 103a.

The cover 111 and the case 117 will now be described in detail with reference to FIGS. 2(a), 2(b) and 3(a) to 3(c). The cover 111 and the case 117 are integrally formed using a plastic material such as heat-resisting ABS, polycarbonate or other suitable thermal insulative plastic material. An electrode-less plating of metal as en electromagnetic shielding treatment is applied to the thick line portions in the figures to form metallic layers 130 and 131. Such a plating step should coat a sufficient portion of the cover 111 and case 117 to surround the electronic components with a metallic shielding layer. In order to ensure a uniform or at least substantially uniform plating of the metal in the electromagnetic shield treatment, the plastic material of the housing including the cover 111 and case 117 should be designed so that the roundness of each corner produced in the finished molded article is sufficient to enable the continuous coating of the electromagnetic shielding on the cover 111 and case 117. By experimentation, it has been determined that 0.5 mm in radius provides satisfactory and secure performance in this regard. However, lesser radius' may be utilized to the extent that they are sufficient to allow uniform complete, substantially plating of the electromagnetic shielding. Further, while such an electromagnetic shielding coating may be relatively thin, and need be only thick enough to provide a uniform coating, experimentation has demonstrated that a coating approximately 5 times thicker than the minimum coating provides optimum performance.

The portion of the case 117 in which a heat-generating component is to be disposed is relieve to form a hole 117g. On the back of the case 117 is projectingly formed a lock receptacle 11 which is adapted to penetrate a hole 118k of the heat radiation plate 118 upon assembling and is thus formed in a position opposed to the lock receptacle 11.

In the peripheral edge of the cover 111 is formed a channel shaped recess 111d, a side wall of which partially constitutes a convex projection 111b. Further, at portions requiring an electrical contact with a logic module 103a there is formed a projection 111c having a channel shaped recess 111e, in which recess is fitted a shield ring 102a.

In the upper end face of the side wall of the case 117 is formed a channel shaped recess 117h for engagement with the convex projection 111b of the cover 111. A side wall of the recess 117h partially forms a convex projection 117a for engagement with the channel shaped recess 111d of the cover 111. In the recess 117h of the case 117 is fitted an O-ring 108.

Figure 5A:
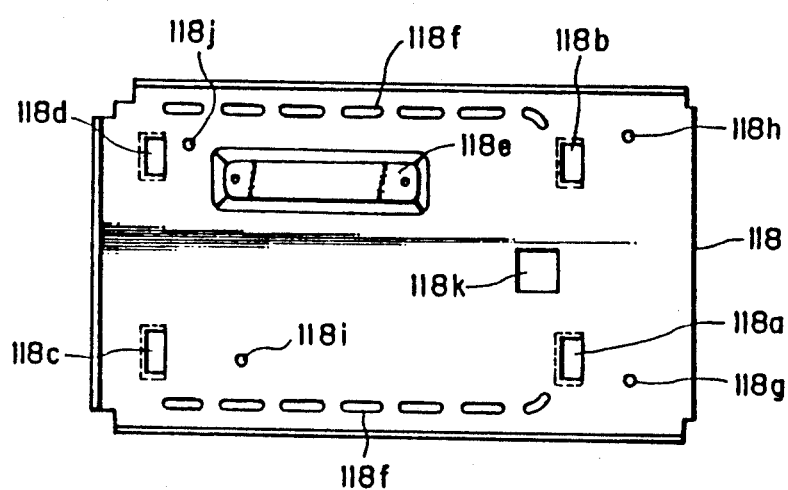
FIG. 5(a) is a plan view of the heat radiation plate used in the embodiment of FIG. 1.
Figure 5C:
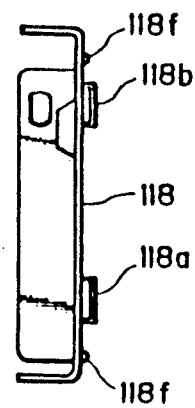
FIG. 5(c) is a right side view thereof.
Figure 5B:
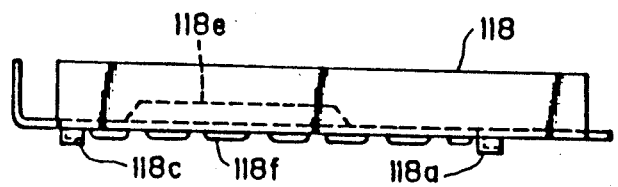
FIG. 5(b) is a front view thereof.
Figure 18A:
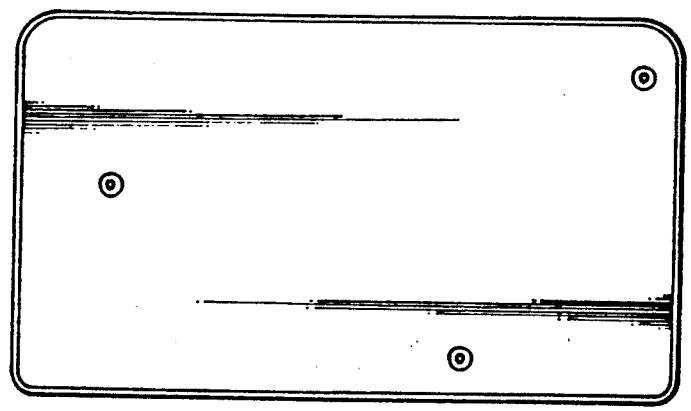
FIG. 18(a) is a plan top view of a Prior Art electronic device housing.
Figure 18B:
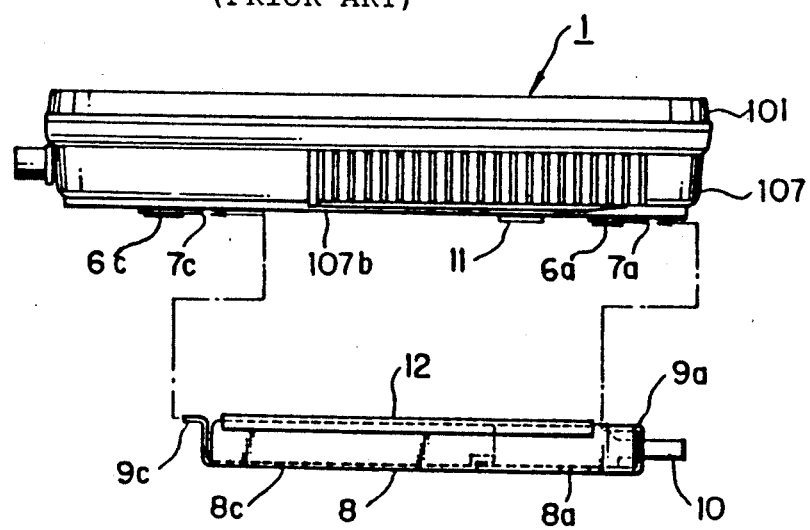
FIG. 18(b) is a front view thereof.
Figure 18C:
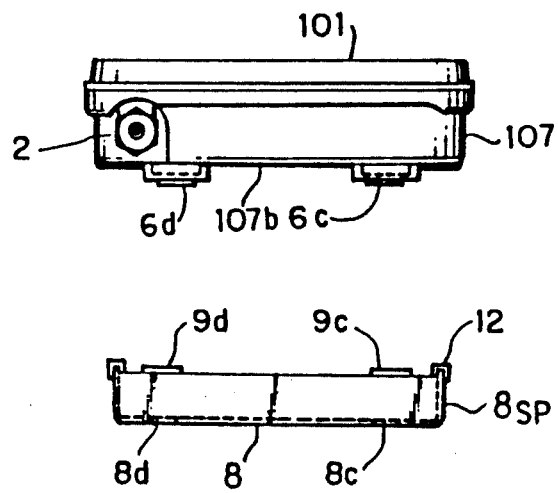
FIG. 18(c) is a left side view thereof.
Figure 18D:
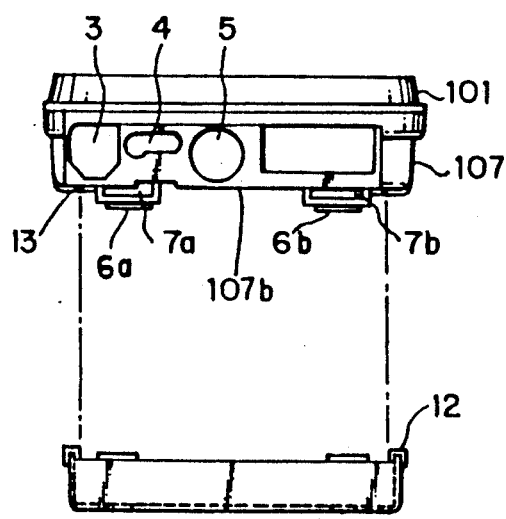
FIG. 18(d) is a right side view thereof.

Part of the heat radiation plate 118 (illustrated in detail in FIGS. 5(a)–(c)) is formed with a projection 118e configured to pass through the hole 117g for mounting of a heat-generating component 105 thereto. At the four corners of the heat radiation plate 118 are formed receptacle portions 118a–118d formed by shearing corner portions from the sheet metal heat radiation plate 118 to facilitate engagement with pawls or tabs 9a–9d of the mounting bracket 8 (FIGS. 18(b), (c)). Also at the corner portions thereof are provided abutting portions 118f formed by embossing, the abutting portions 118f serving as guide portions in mounting the transceiver 1 onto the mounting bracket 8.

In this preferred embodiment, the heat radiation plate 118 is an aluminum plate which is light in weight and superior in both heat conductivity and electroconductivity. It is bent on three sides thereof for opposed contact with side faces of the transceiver to ensure a wide heat radiation area to thereby enhance the heat radiation effect. A subsidiary benefit to this embodiment of the heat radiation plate 118 is that it also serves to protect the case 117 from impacts, strengthening the case and protecting the metal layer 130 from possible damage. Numerals 118g to 118j represent bolt holes for mounting the heat radiation plate 118 to the back of the case 117 with bolts or the like. The heat radiation plate 118 is obtained by machining a commercially available aluminum plate with only the outer surface thereof subjected to a coating treatment (color coat). The inner surface thereof which comes into contact with the case 117 is not coated, with good electroconductivity ensured.

The metallic layer 130 of FIG. 3(a) is formed on the bottom of portion of the case 117 which comes into contact with the heat radiation plate 118, so when both are fixed together firmly, the potential across the two becomes substantially zero.

Figure 20A:
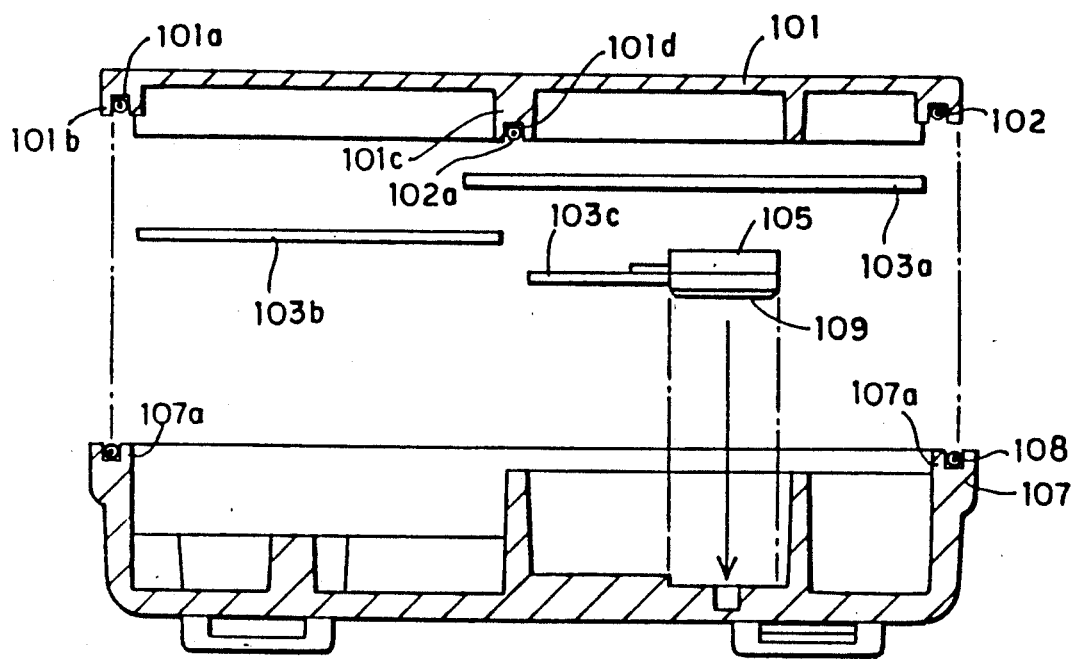
FIG. 20(a) is a transverse sectional view taken along lines C—C of FIG. 19.
Figure 20B:
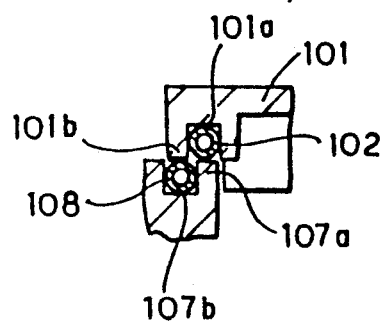
FIG. 20(b) is an enlarged sectional view of an abutment between a cover and a case.
Figure 20C:
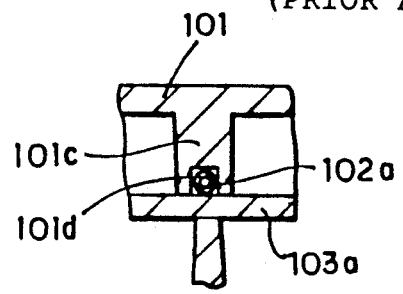
FIG. 20(c) is an enlarged sectional view of an abutment between a projection of the cover and a logic module.

Other constructional conditions of this embodiment are the same as in the prior art illustrated in FIGS. 18 to 20.

In the construction of the embodiment described above, when the heat radiation plate 118 is mounted to the case 117 firmly with bolts for example, the metallic layer 130 formed on the back of the case 117 and the electroconductive surface of the heat radiation plate 118 coming into contact with each other, so that a completely electromagnetic-shielded housing is obtained except the open side of the case 117.

In the interior of the case 117, a receiver/synthesizer module 103b and a transmitter module 103c are mounted with bolts or the like. A heat generating component such as the transmission power amplifier 105 is mounted directly or through a good heat conduction medium 109 to the projection 118e of the heat radiation plate 118 penetrating the hole 117g formed in the bottom of the case 117, and a shielding plate (not shown) is mounted over the transmitter module 103c. Further, the logic module 103a is mounted over the shielding plate.

Since the metallic layer 130 is formed in the interior of the case 117 and the case is at the same potential as the heat radiation plate 118, it is possible to shield between modules, for example between the receiver/synthesizer module 103b and the transmitter module 103c, electromagnetically using a partition wall 117e.

Further, a partition wall 117f formed on the bottom of the case 117 comes into contact with an grounding portion of the surface of the receiver/synthesizer 103b module located between the receiver portion and the synthesizer portion to thereby prevent electromagnetic interference between circuits. The heat from a heat-generating component such as the transmission power amplifier 105 is conducted to the exterior of the case 117 and radiated into the outside air through the heat radiation plate 118. As the case 117 is thermally non-conductive, little heat is transmitted to other components within the case 117.

As previously noted, the case 117 is formed of a synthetic resin which is a good thermal insulator (bad heat conductor), so in comparison with the conventional case 107 formed by die casting of aluminum, the heat generated from the transmission power amplifier 105 does not easily reach the receiver/synthesizer module 103b and the components disposed thereon including the TCXO 104 which is sensitive to temperature, so for a predetermined working temperature range of the device, it becomes possible to employ a TCXO 104 of a lower cost with a narrower temperature range as compared with conventional ones since temperature variations caused by heat radiated from the transmission power amplifier 105 (a heat generating component) do not occur.

At the time of mounting of the cover 111 and the case 117, as shown in FIGS. 3(a) to 3(c), the metallic layers 131 and 130 on the inner surfaces of the cover 111 and the case 117, respectively, come into complete contact with each other through a shield ring 102, whereby the open side of the case 117 is completely closed electromagnetically. Consequently, the internal circuits are protected from an external electromagnetic disturbance energy and undesired electromagnetic energy generated from the internal circuits is prevented from leaking to the exterior, so there is no fear of disturbance to other electronic devices.

The projection 111C of the cover 111 comes positively into contact with an grounding portion on one side of the logic module 103a through the shield ring 102a, thus permitting electromagnetic shielding between circuits of the logic module 103a.

On the other hand, the O-ring 108 of the case 117 is pressed strongly by the convex projection 111b of the cover 111 and is deflected, so that the case 117 assumes a hermetically sealed state. Therefore, even when the case 117 is exposed to water drops, etc., there is no fear of entry of moisture into the case, and thus the interior of the case is sure to be protected.

The electronic device housing of the above construction is attached to the mounting bracket 8 by a conventional method. More particularly, the housing is slid on the rail 12 of the mounting bracket 8 while being guided by the abutting portions 118f of the heat dissipation plate 118 until the pawls or tabs 9a-9d of the mounting bracket are fitted in the receptacle portions 118a-118d of the heat radiation plate 118 and the lock receptacle 11 projecting downwards from the bottom of the case 117 comes into engagement with the front end of the release lever 10, whereby the transceiver 111 is locked to the mounting bracket 8. Where a high surface accuracy is required, with reduced distortion, it is preferable that the abutting portions 118f be formed of a plurality of circular shaped portions formed by embossing.

In machining the heat radiation plate 118, a hole, such as one of the mounting screw holes 118s on the projection 118e may serve as a common point between the heat radiation plate and the case 117 may be specified as a dimensional reference point.

EXAMPLE 1

Figure 21:
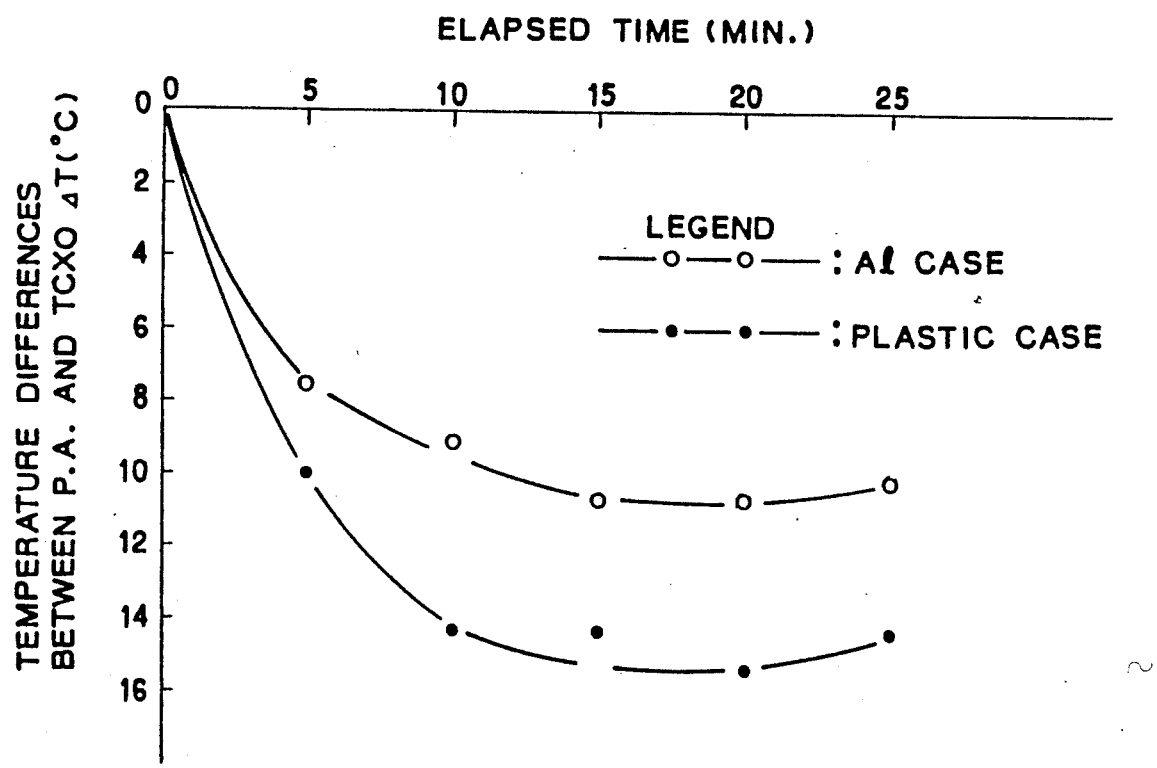
FIG. 21 is a graphical representation of the experimental tests described in Example 1.

A test was conducted to determine the improvement in thermal isolation performance between a housing produced according to the teachings of the present invention and a prior art housing. The tests were performed on a mobile telephone system employing the components described in the present specification. Specifically, the prior art aluminum housing example was a described in FIGS. 18-20 of the present specification. The example of the present invention was a sample of the preferred embodiment of FIGS. 1-3. A test was performed to determine the effect of the heat generated by the heat generating component, the transmission power amplifier 105, on the TCXO 104 of the receiver/synthesizer module 103b. The same circuit components were utilized in each housing to eliminate possible variations due to component tolerances. From initiation of operation of the mobile communication device, the temperature difference between the transmission power amplifier 105 and the TCXO 104 was monitored with respect to time for each device. As can be seen from the attached FIG. 21 which is a graphical representation of the temperature difference between the transmission power amplifier 105 and TCXO 104 with respect to time, there was an approximate two degree centigrade additional temperature difference between the operating temperature of the transmission power amplifier 105 and that of the TCXO 104 when disposed in the housing produced according to the teachings of the present invention. Thus, the improved case according to the teachings of the present invention was able to keep the TCXO, a temperature sensitive component, substantially cooler when compared with the transmission power amplifier 105 and its temperature, thus substantiating the improvements discussed hereinabove.

Although in the above embodiment, the cover 111 and the case 117 have the metallic layer only on the respective one sides opposed to each other, the metallic layer may be formed on both sides as shown in FIG. 4, whereby the shielding effect can be enhanced. Further, although the metallic layer was formed by electrodeless nickel plating on an electrodeless plated copper undercoat, any other metallic layer which exhibits the same effect may be used.

Although an electrodeless metal plating was adopted for electromagnetic shielding, it is possible to adopt nickel- or copper-based electroplating and vacuum deposition selectively according to the amount of shielding desired, cost and other characteristics. Also by silver or aluminum based electrocoating, metal spraying or metal electroplating there will be obtained an equal shielding effect.

Figure 6:
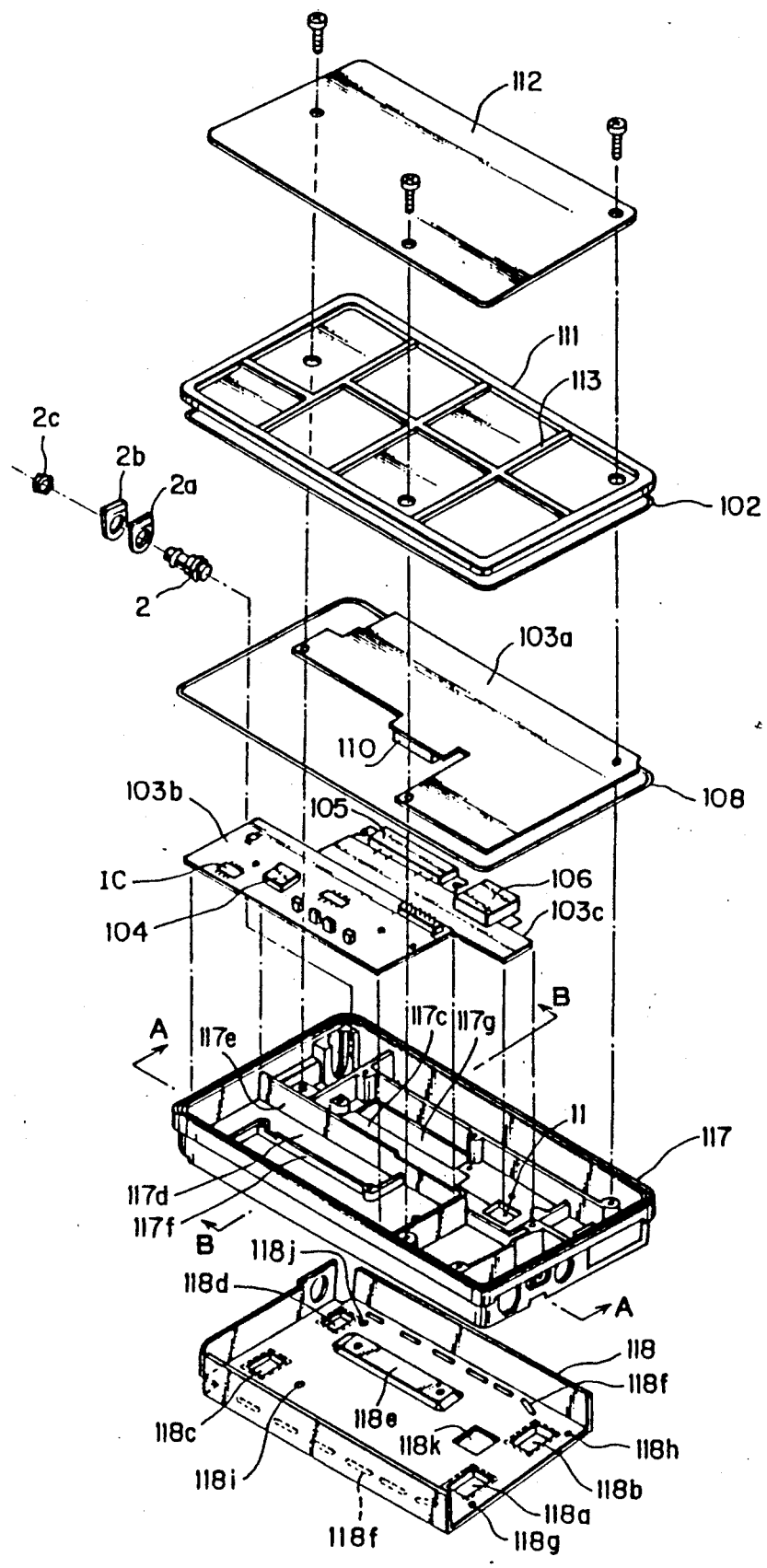
FIG. 6 is an exploded perspective view of an electronic device housing according to another embodiment of the present invention.

The portions on which the metallic layers 130 and 131 are to be applied can be selected optionally, so where there is a fear of a component on a module coming into contact with the case 117 or the cover 111 and causing a short-circuit accident, etc., it is possible to avoid the application of a metallic layer to the portion concerned. Further, although the cover 111 is flat except its convex portion having a recess, there may be used beams or ridges 113 on the side opposed to the case 117 in order to enhance strength such as a deflecting strength (FIG. 6). No matter whether the beams may be disposed on the outer surface side or on both sides, the effect thereof can be exhibited.

Where the beams 113 are disposed on the outer surface side of the cover 111, the appearance will be very awkward unless some consideration is given designwise. To cover the beams 113 there may be mounted a decorative metallic plate 112 over the beams 113, as shown in FIG. 6.

Figure 7A:
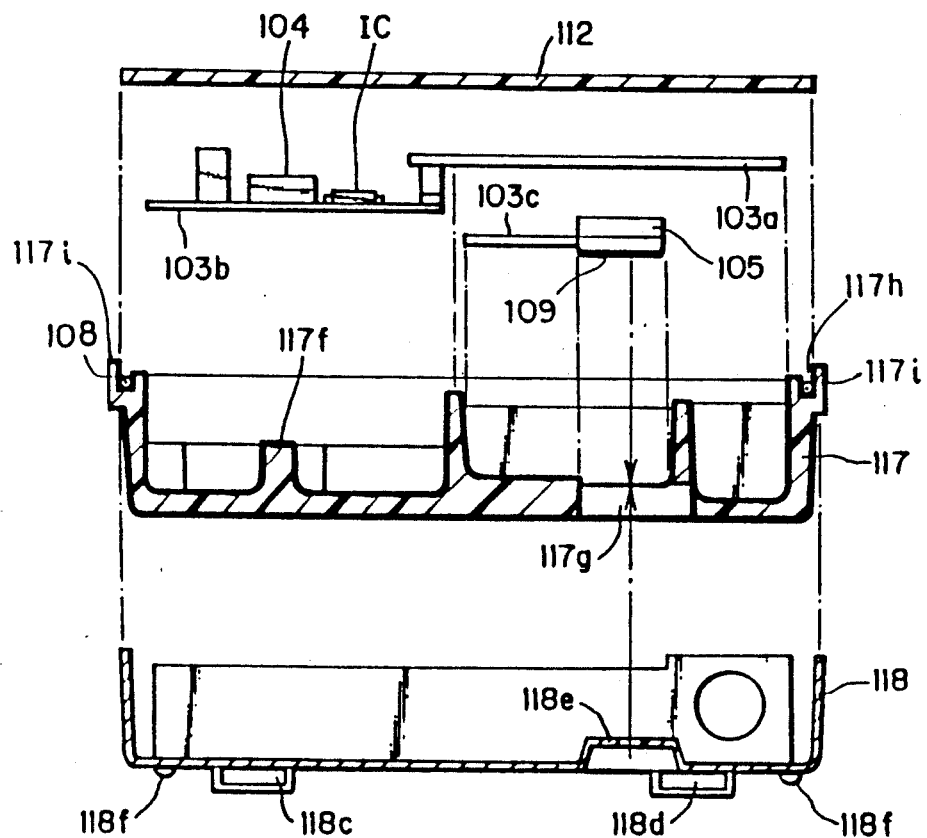
FIG. 7(a) is a transverse sectional view taken along lines B—B of FIG. 6 of a cover, a case and a heat radiation plate as separated from one another according to this further embodiment of the present invention.
Figure 7B:
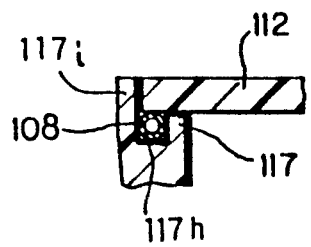
FIG. 7(b) is an enlarged sectional view of an abutment between the cover and the case in the embodiment of FIG. 6.

By forming the cover 111 integrally using a synthetic resin it is possible to easily form the beams 113 and the convex portions 111b, 111c which are difficult to be formed by sheet metal working. If these features are unnecessary and in order to obtain a shielding effect for electromagnetic disturbance energy from or to the exterior, the cover 111 may be replaced by a decorative metallic plate 112, and in this case, the outside wall 117i of the recess 117h formed in the peripheral portion of the case 117 has a height flush with the decorative metallic plate 112 and the shield ring 102 is fitted in the recess to obtain a shielding effect, as shown in FIGS. 7(a) and 7(b).

In general, it is well-known to make the thickness of molded articles as uniform as possible and particularly make the thickness of a rib, etc., formed at the interior of the articles less than 70% of the mean thickness in order to prevent any overflow of molten resin and trouble in appearance. It is possible to thicken the partition wall of blocks in a circuit to be insulated from heat of heating elements or other temperature variations so as to further enhance the heat insulating effect, thereby more positively utilizing the heat insulating effect of the synthetic resin of the case 117.

Figure 8A:
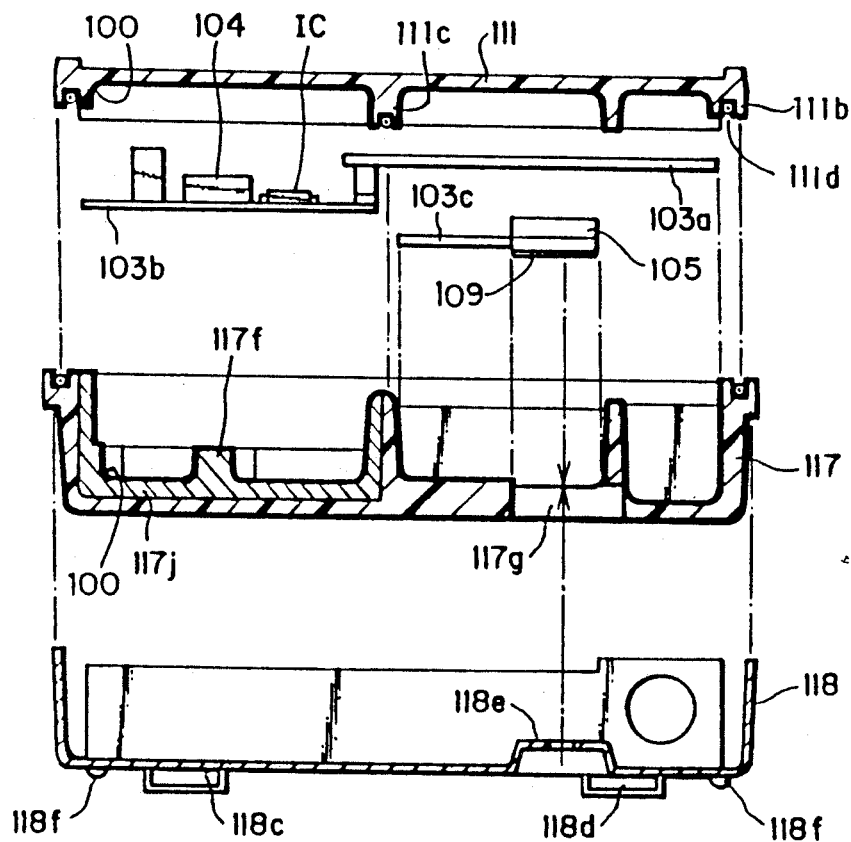
FIG. 8(a) is a transverse sectional view of a cover, a case and a heat radiation plate as separated from one another according to a still further embodiment of the present invention.

FIG. 8(a) shows a cover, a case and a heat dissipation plate in which there is inserted a block 117j which is molded from an insulative foam composition (foamable resin incorporating a foamable catalyst) in advance, within the entirety of the case 117 molded with a resin of higher strength whereby a large insulating effect can be obtained while retaining the mechanical strength of the case.

Figure 8C:
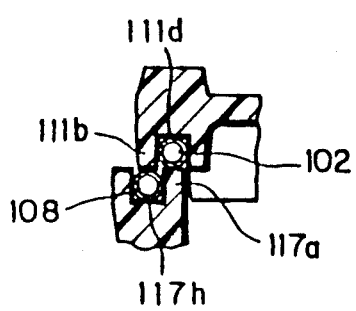
FIG. 8(c) is an enlarged sectional view of an abutment between the cover and the case.
Figure 8D:
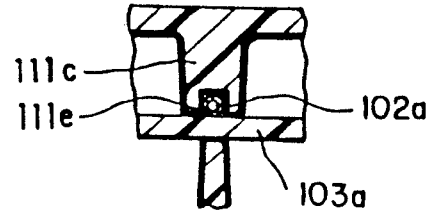
FIG. 8(d) is an enlarged sectional view of an abutment between a projection of the cover and a logic module.
Figure 8B:
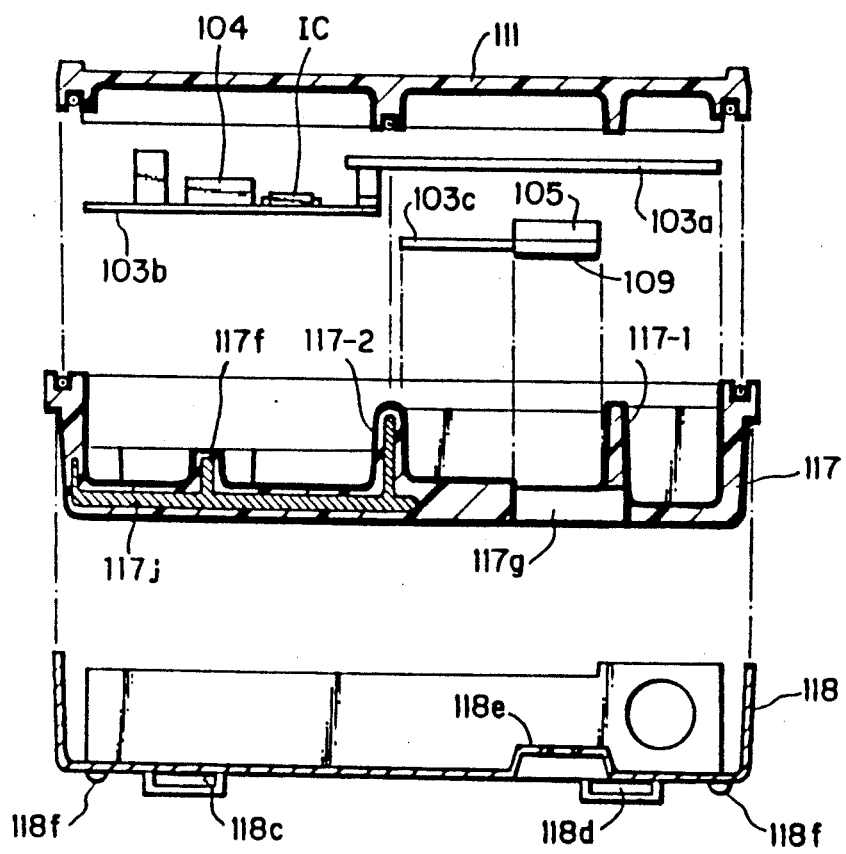
FIG. 8(b) is a transverse sectional view showing a modified embodiment of FIG. 8(a)

FIG. 8(b) shows a case 117 manufactured by process more simple than that of the parts in FIG. 8(a), wherein so-called RIM (Reaction Injection Molding) and SF (Structural Foam) molding are applied so that thin thickness portions 117-1 may be molded in high density and thick thickness portions 117-2 may be molded in low density (in this case, a foamed resin intermediate the core portion of the resin) and as the result, the heat insulating effect of the thick thickness portions 117-2 can be greatly enhanced, molding of a skin results in solution of a problem in appearance and there can be attained further effects of saving of materials and lightening in weight due to the use of such a foamed resin. Preferably, the thick thickness portions should have a mean thickness of approximately 1½ times the mean thickness of the remaining thin thickness portion so that temperature insulation may be enhanced.

FIG. 8(c) is an enlarged sectional view of an abutment between the cover 111 and the case 117, and FIG. 8(d) is an enlarged sectional view of an abutment between the projection 111c of the cover 111 and the case 117. The structures of FIGS. 8(c) and 8(d) are similar to those of FIGS. 20(b) and 20(c).

Figure 9:
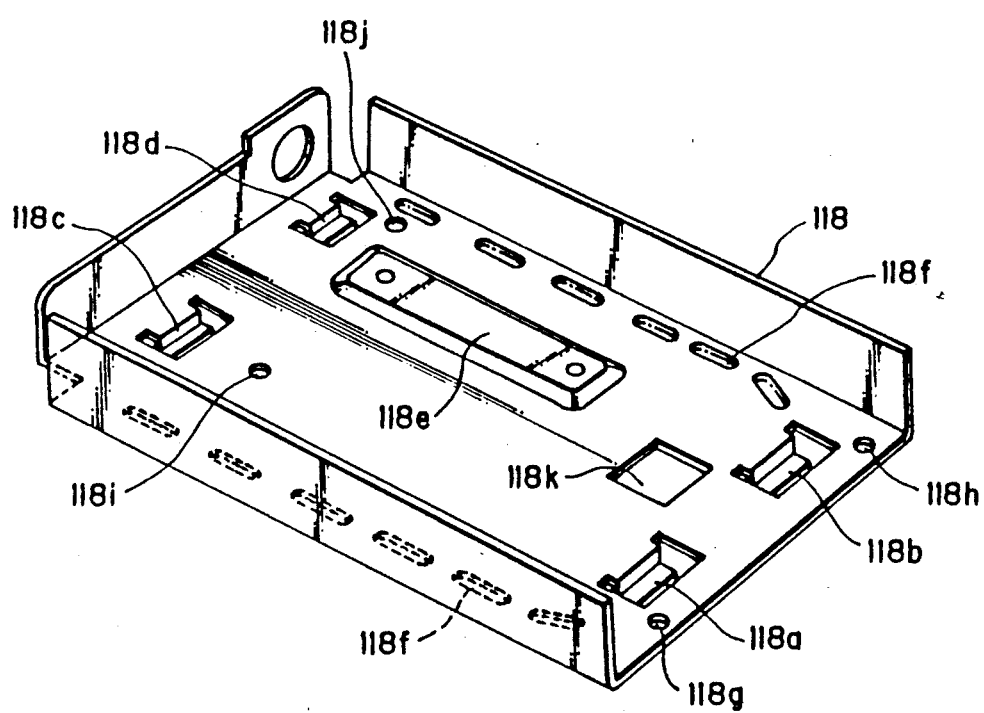
FIG. 9 is a perspective view showing a further example of a heat radiation plate.

Although in this embodiment the receptacle portions 118a-118d of the heat radiation plate 118 were formed by deep drawing and tearing off, these receptacle portions 118a-118d may be formed by blanking and bending as shown in FIG. 9, whereby the same effect can be attained.

Figure 10B:
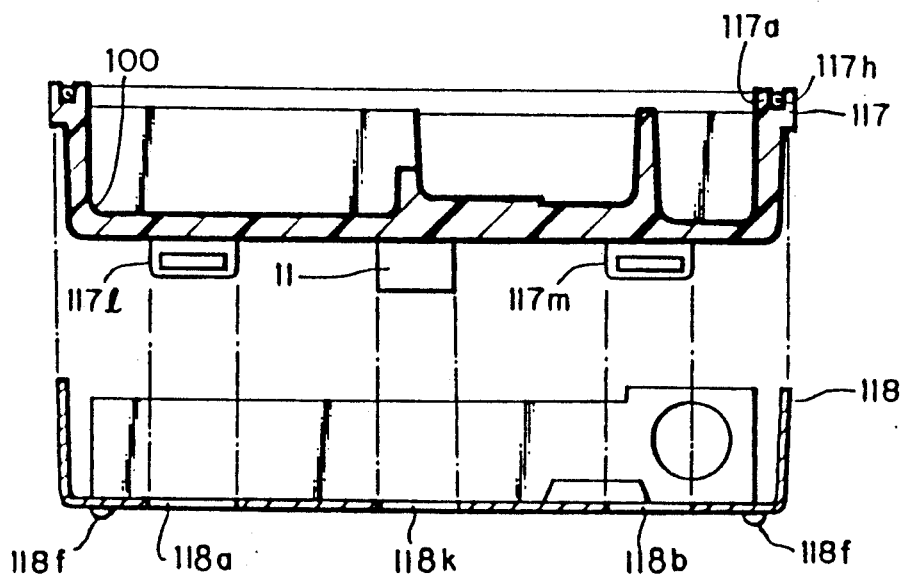
FIG. 10(b) is a transverse sectional view taken along line E—E of FIG. 10(a)
Figure 10A:
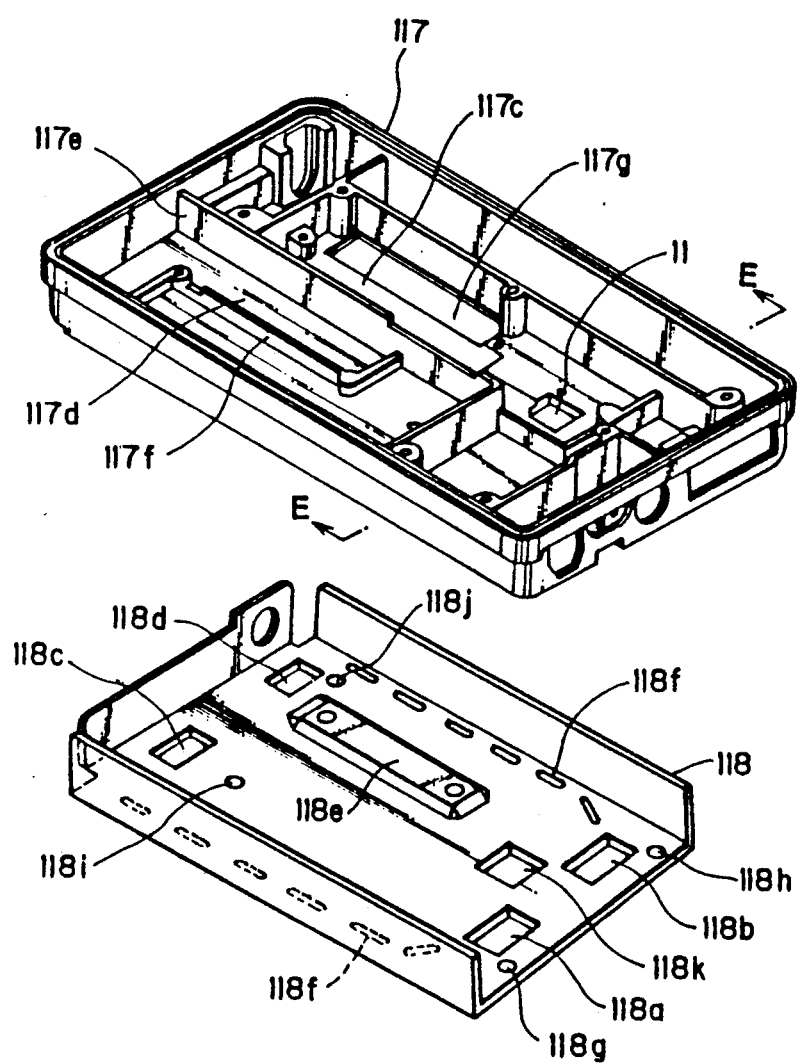
FIG. 10(a) is an exploded perspective view showing still further examples of a case and a heat radiation plate.

FIG. 10(a) is an exploded perspective view showing modified alternative embodiments of the case 117 and that of the heat radiation plate 118. FIG. 10(b) is a transverse sectional view taken along line E—E of FIG. 10(a). The receptacle portions 118a-118d in the previous embodiment were formed by deep drawing and tearing off, while in the embodiment illustrated in FIGS. 10a) and 10(b), legs 1171-117o project from the back of the case 117 in the positions corresponding to the positions of the receptacle portions 118a-118d, and in the heat radiation plate 118 there are formed circular or square holes 118a-118d for passing therethrough of the legs 1171-117o. By this construction the occurrence of distortion caused by drawing on the heat radiation plate is diminished and the die cost is reduced.

Figure 11A:
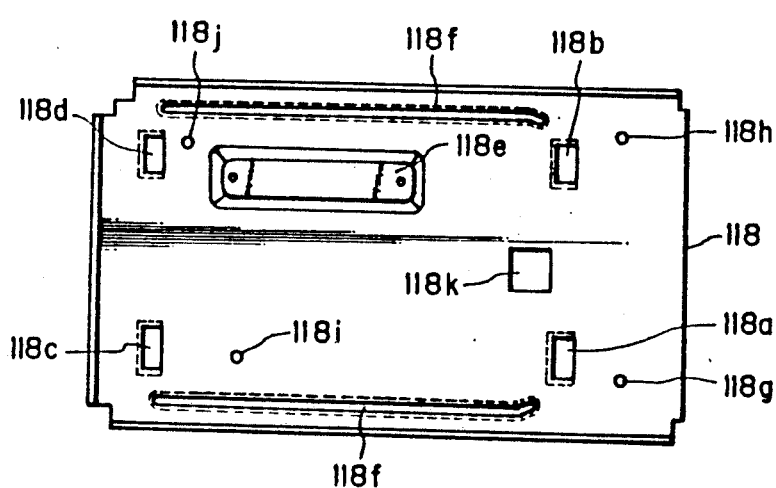
FIG. 11(a) is a plan view showing a still further example of a heat radiation plate.
Figure 11C:
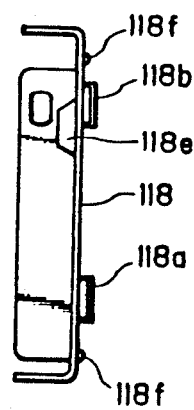
FIG. 11(c) is a right side view thereof.
Figure 11B:
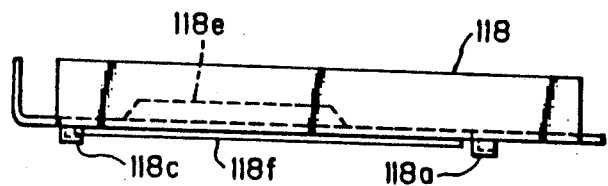
FIG. 11(b) is a front view thereof.

FIG. 11(a) is a plan view showing a modification of the heat radiation plate 118, FIG. 11(b) is a front view thereof, and FIG. 11(c) is a side view thereof. The abutting portions 118f of the heat radiation plate in the previous embodiment were formed in a large number elliptically or circularly by embossing, while in this embodiment they are formed as continuous rectilinear rails, which permit a smooth sliding motion.

Figure 12A:
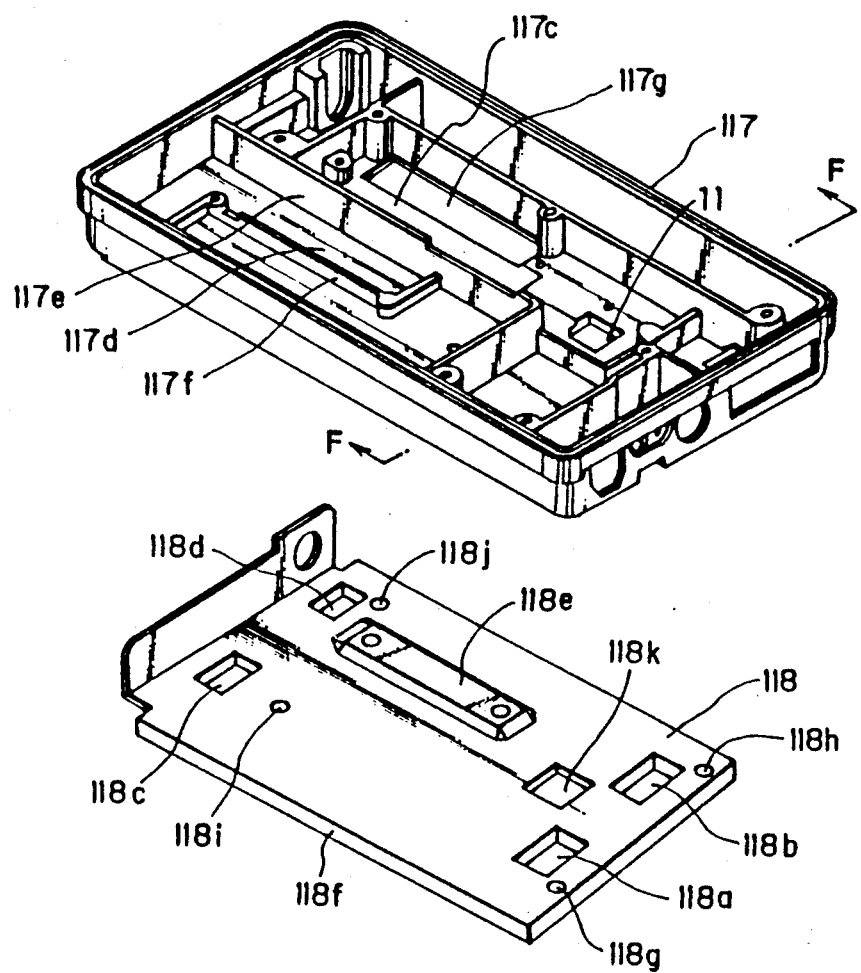
FIG. 12(a) is an exploded perspective view showing still further examples of a case and a heat radiation plate.
Figure 12B:
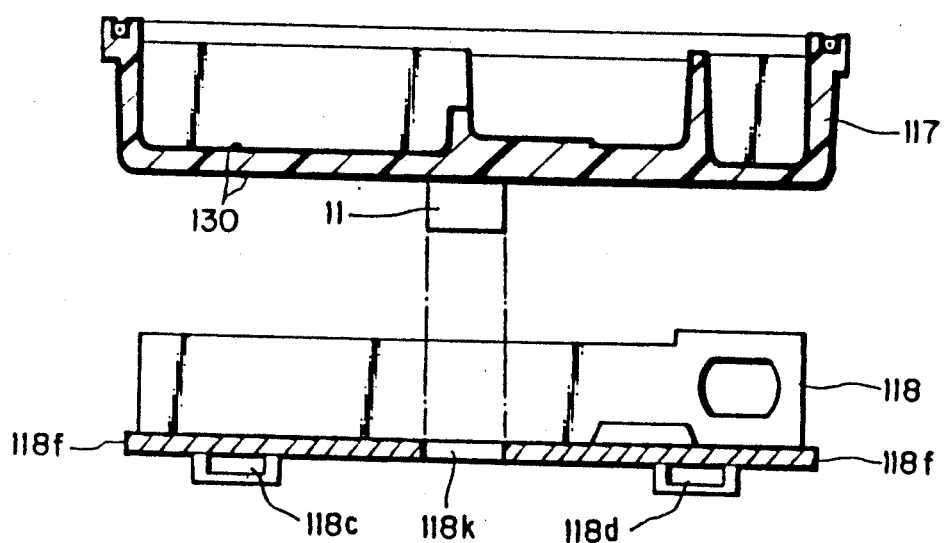
FIG. 12(b) is a transverse sectional view taken along line F—F of FIG. 12(a)

FIG. 12(a) is an exploded perspective view showing a modification of the case 117 and that of the heat radiation plate 118, in which the heat radiation area is somewhat reduced, and FIG. 12(b) is a transverse sectional view taken along line F—F of FIG. 12(a). In this embodiment, both side portions of the heat radiation plate 118 are removed and, in their place, the plate is bent downwardly to form the abutting portions 118f, allowing both side faces of the heat radiation plate 118 to serve as the abutting portions.

Although an aluminum plate was used in the above embodiments, any other good heat conductor may be used; for example, a copper plate which exhibits the same heat radiation effect.

A good heat conductor block 119 may be used in connection with the projection 118e of the heat radiation plate 118 formed by deep drawing to conduct heat away from the transmission power amplifier 105. This heat conductor block 119 formed so as to come into close contact with the inner wall of the concave side may be fitted in the concave side so that the heat from such a heat-generating component may be rapidly transmitted to the whole surface of the heat radiation plate 118.

Figure 13A:
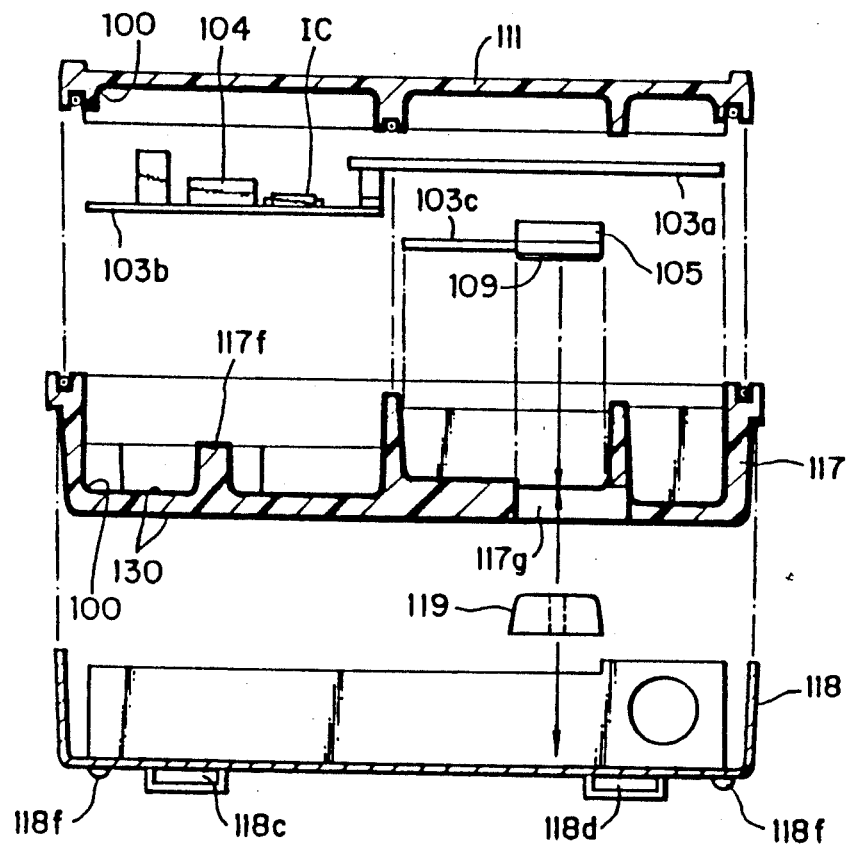
FIG. 13(a) is a transverse sectional view of a cover, a case and a heat radiation plate as separated from one another according to a still further embodiment of the present invention.
Figure 13B:
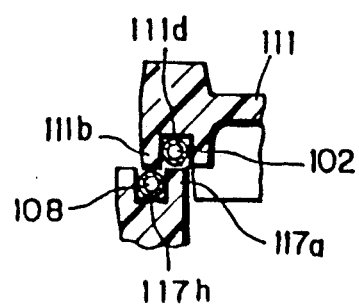
FIG. 13(b) is an enlarged sectional view of an abutment between the cover and the case.
Figure 13C:
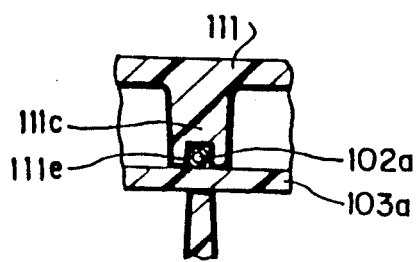
FIG. 13(c) is an enlarged sectional view of an abutment between a projection of the cover and a logic module.

This good heat conductor block 119 may be mounted on a flat surface of the heat radiation plate 118 as shown in FIGS. 13(a) to 13(c). The good heat conductor block 119 may be formed by die casting or by drawing and may be mounted using machine screws or by rivet caulking which is inexpensive and thermally conductive.

The holes 118g-118j formed in the heat radiation plate 118 are for passing bolts therethrough to fix the heat radiation plate 118 to the case 117. Alternatively, lugs may be formed on the case 117 side so as to pass through the holes 118g-118j and heat-welded to the outside of the heat radiation plate 118 to fix the latter to the case 117.

Figure 14:
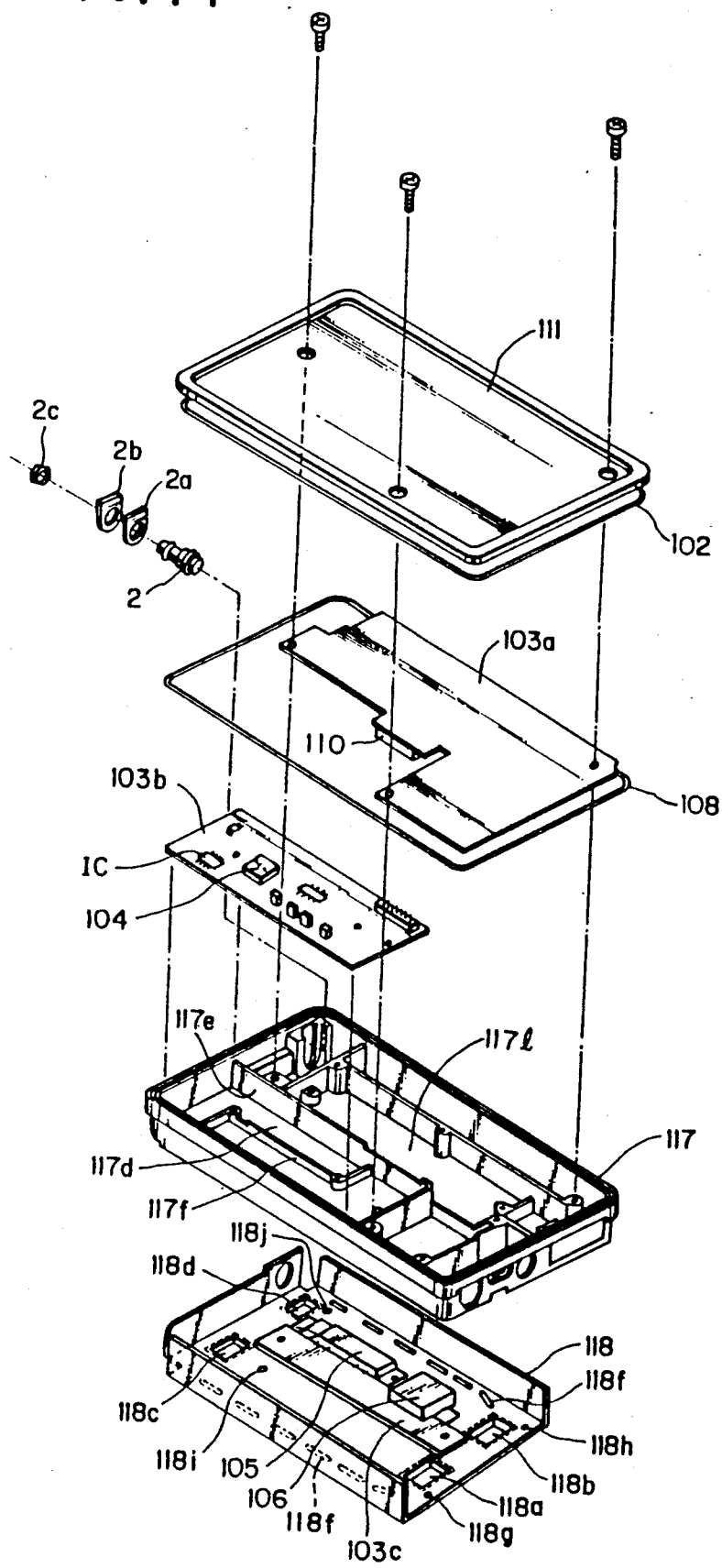
FIG. 14 is an exploded perspective view of an electronic device housing according to a still further embodiment of the present invention.

Although in the above embodiments the transmitter module 103c having the transmission power amplifier 105 is attached to the case 117 after the mounting of the heat radiation plate 118, the case 117 is an obstacle when a monolithic test of the module 103c is conducted. To avoid this, as shown in FIG. 14, an opening 117l of a size which permits the transmitter module 103c to pass therethrough may be formed in the bottom of the case 117. In this embodiment, the module 103c having the transmission power amplifier 105 is first mounted to the heat radiation plate 118 and then the heat radiation plate with the module 103c is mounted to the case 117, whereby only the transmitter module can be subjected to a monolithic test in a state permitting heat radiation.

Figure 15A:
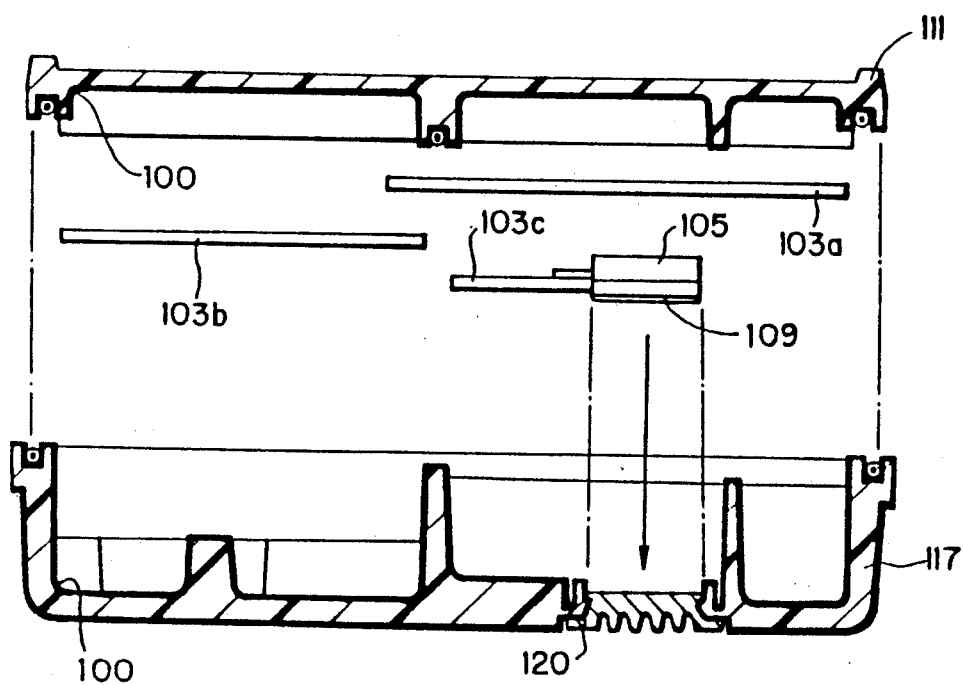
FIG. 15(a) is a transverse sectional view showing a still further example of a case.
Figure 15B:
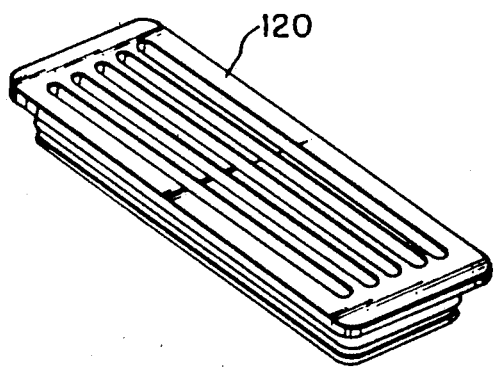
FIG. 15(b) is a perspective view seen from the surface of a heat radiation block to be mounted to the case.
Figure 15C:
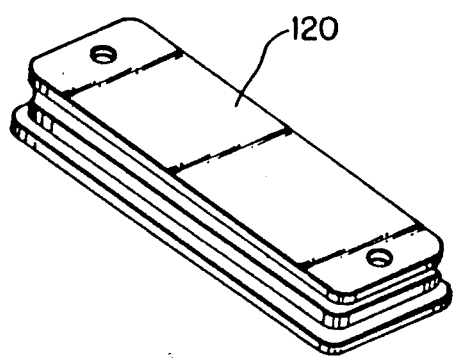
FIG. 15(c) is a perspective view seen from the back of the heat radiation block.

Although in the above embodiments the whole of the transmitter module is attached to the heat radiation plate 118, in case of a heat-generating component which generates only a small amount of heat or when a monolithic test of the transmitter module requires only a short time, a heat radiation block 120 having such surface and back as shown in FIGS. 15(b) and 15(c), which are perspective views, may be mounted to the case 117, for example, by a snap-fit method. Alternatively, the heat radiation block 120 may be insert-molded at the time of molding of the case 117.

Figure 16:
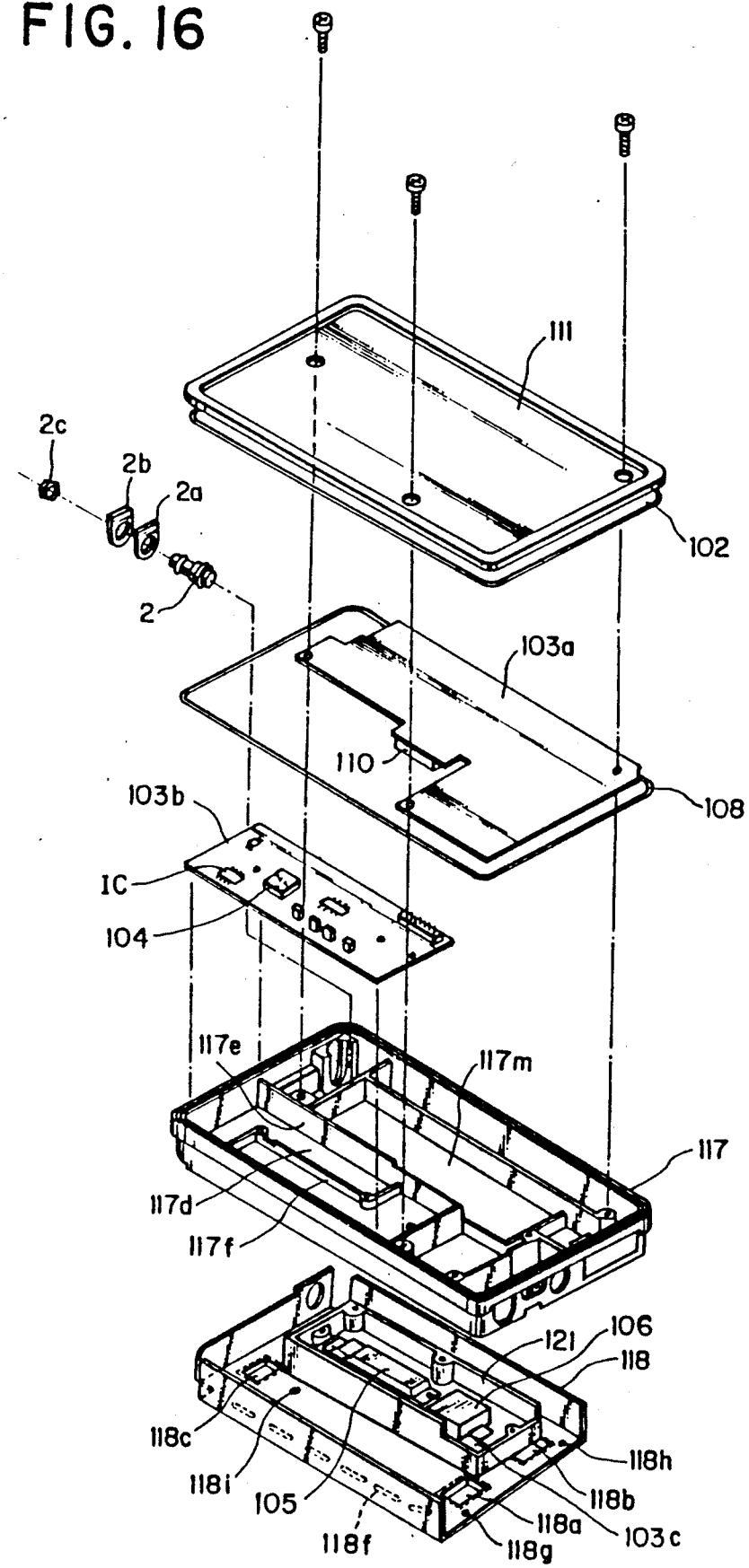
FIG. 16 is an exploded perspective view of an electronic device housing according to a still further embodiment of the present invention.

In order to further ensure the effect of heat radiation and that of electromagnetic shielding, a thermally conductive heat radiation block 121 having a conductive shielding wall may be mounted on the heat radiation plate 118, as shown in FIG. 16. In this case, the transmitter module 103c having the transmission power amplifier 105 is mounted in the portion of the heat radiation plate surrounded with the shielding wall of the heat radiation block 121, while an opening 117m for insertion therethrough of the heat radiation block 121 is formed in the case 117, and the heat radiation plate 118 is mounted to the case 117.

Figure 17A:
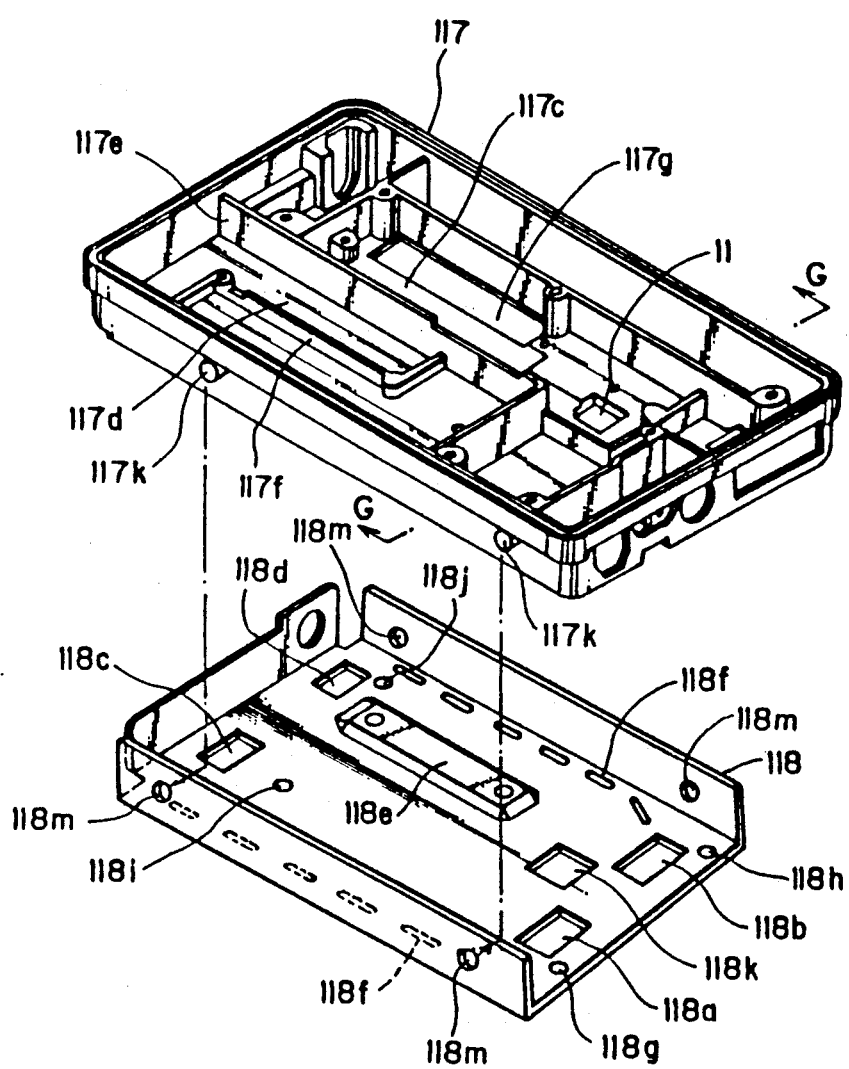
FIG. 17(a) is an exploded perspective view showing still further examples of a case and a heat radiation plate.
Figure 17B:
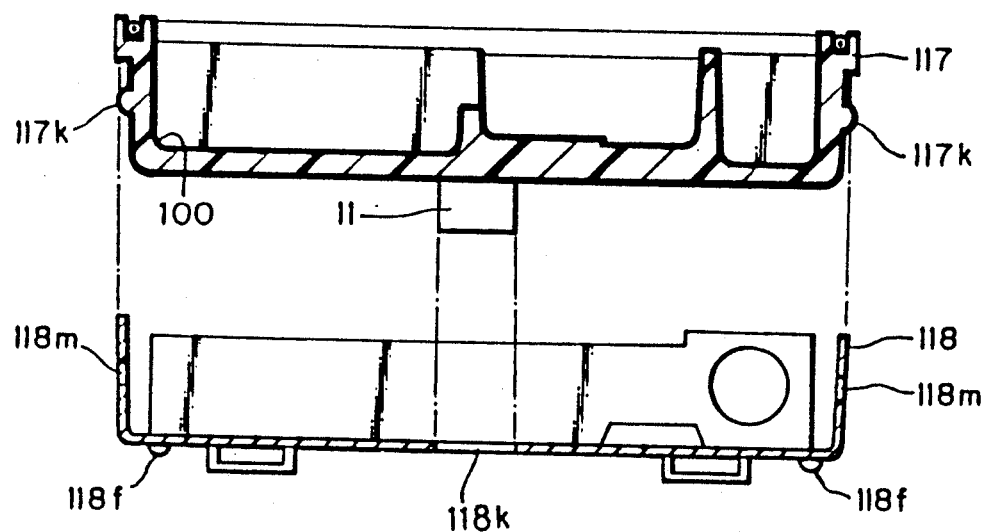
FIG. 17(b) is a transverse sectional view taken along line G—G of FIG. 17(a)

Although in the above embodiments the case 117 and the heat radiation 118 are fixed together with bolts, embossed lugs 117k or protrusions for positioning and fixing may be formed on the side of the case 117, while on the heat radiation plate 118 is provided with recesses or holes 118m in a corresponding relation to the lugs 117k or protrusions, as shown in FIGS. 17(a) and 17(b) to facilitate assembly therebetween. Alternatively the lugs 117k may be provided on the heat radiation plate while the recesses 118m are provided on the case 117. Then, by assembling so that they come into engagement with each other, positioning can be done easily and the mounting accuracy is improved.

Further, although in the above embodiments the heat radiation plate 118 is attached to the case 117, it is not necessary to use the heat radiation plate 118 when the heat from the device to be encased in the case 117 is small. In this case, the provision of only the case 117 and the cover 111 is sufficient.

According to the present invention as described hereinabove, a novel electronic component case is manufactured inexpensively and includes unique temperature management functions. Such case isolates or insulates temperature sensitive components from environmental temperature variations by insulating such temperature sensitive components from wide temperature fluctuations, reducing the necessary operating temperature range of such components. The novel electronic component case manufactured according to the teachings of the present invention further includes novel thermal transfer abilities which enable the case to efficiently transfer undesired heat from heat generating components such as power amplifiers or the like, by providing a heat communication path to the atmosphere from such components, without providing a heat communication path between the heat generating components and other electronic components such as thermally sensitive components and without providing a thermal path between such other components and the atmosphere.

As set forth hereinabove, at least the case of the electronic device housing comprising the case and the cover is formed by molding using a synthetic resin capable of exhibiting a heat insulating effect, whereby even a complicated molding structure can be attained in an increased number of shots with little damage to the die, and without requiring such secondary machinings as punching and surface coating it is possible to obtain an electronic device housing which is easy to machine, light in weight and less expensive.

Further, since the corner portions of the case are rounded largely, it is easy to form a metallic layer on the case surface continuously at a uniform thickness without a break, and in cooperation with the cover attached to the open side of the case it is possible to positively shield the case electromagnetically. Besides, a satisfactory drip-proofing effect can be attained by the waterproof means provided in the abutment between the case and the cover.

Moreover, the mechanical strength of the case can be fully enhanced by the heat radiation plate mounted to the outside of the case, and it is possible to enhance the heat radiating effect in the interior of the case.

Additionally, by forming a partition wall integrally in the interior of the case it is possible to heat-insulate the partitioned spaces from each other, and by the metallic layer formed on the surface of the partition wall it is possible to shield the partitioned spaces from each other electromagnetically.

The above described preferred embodiments illustrate various ways of accomplishing the features of the present invention set forth in the appended claims, which are the sole measure of applicant's invention.

What is claimed is:

1. A housing for an electronic device having a first circuit with an operating parameter affected by variations in temperature and a second circuit developing undesired heat to be removed therefrom, said housing comprising:

a case having a bottom and sides formed of a relatively thermally non-conductive material having at least first and second thermally separated cavities for receiving said first and second circuits respectively, said case having an opening between said second cavity and the exterior of said case;

a cover for said case;

a heat transfer plate, thermally communicating between said second circuit and the exterior of said case through said opening for removing heat to the exterior of the case;

said first circuit being thermally isolated from the environment by said thermally non-conductive case while undesired heat is removed from said second circuit via said heat transfer plate to thereby efficiently control the temperature of said first and second circuits.

2. The housing of claim 1 wherein said case fully encloses said first and second cavities and includes means for electrically isolating said first and second circuits from electromagnetic radiation developed both exterior said case and interior said case but outside each circuit's respective cavity.

3. The housing of claim 2 wherein said case is formed of a plastic material coated with an electrically conductive coating, said coating forming said means for isolating.

4. The housing of claim 1 wherein said first circuit includes a temperature sensitive crystal oscillator.

5. The housing of claim 4 wherein said second circuit includes a transmitter power amplifier.

6. The housing of claim 5 wherein said electronic device is a mobile telephone.

7. The housing of claim 1 wherein said container is formed of a thermally insulative plastic material having an electromagnetic shield coating formed therein.

8. The housing of claim 7 wherein said cover is also formed of a thermally insulative plastic material having an electromagnetic shield coating formed thereon.

9. The housing of claim 7 wherein said cover is formed of a metallic material having electromagnetic shielding properties.

10. The housing of claim 8 wherein strengthening ribs are provided on said case or said cover.

11. The housing of claim 1 wherein said heat transfer plate generally conforms to the bottom and at least two sides of said case.

12. A housing for an electronic device having a first circuit with an operating parameter affected by variations in temperature and a second circuit developing undesired heat to be removed therefrom, said housing comprising:

a case formed of a relatively thermally non-conductive material having at least first and second thermally separated cavities for receiving said first and second circuits respectively;

a heat transfer plate including a thermal path operatively communicating with the second circuit when received in said second cavity, for transferring undesired heat from said second cavity to the exterior of said housing;

said thermally non-conductive case surrounding said first cavity thermally isolating the first circuit from the environment when mounted therein while said thermal transfer plate transfers heat from said second circuit when mounted in said second cavity.

13. The housing of claim 12 wherein said electronic device is a mobile telephone.

14. An electronic device housing comprising:

a case having an access opening and formed of an insulating non-conductive material coated on at least one surface thereof with a metallic layer, said case having inside corners formed by intersecting planar portions thereof, said inside corners having a radius sized to enable the substantially uniform coating of said case with said metallic layer;

a conductive cover attached to said case and covering said access opening, said conductive cover being conductively connected to the metallic layer of said case to provide an electromagnet shield for the interior of the case; and a heat transfer plate mounted to the exterior of said case and thermally communicating with the interior of said case through an opening provided therein, said heat transfer plate transferring heat generated by a portion of said device thermally attached thereto to the exterior of said case.

15. The housing of claim 14 wherein said insulating non-conductive material is a synthetic resin.

16. The housing of claim 14 further comprising a waterproof seal provided between said case and said cover.

17. An electronic device housing according to claim 14, wherein said metallic layer is formed on only the inner surface of said case.

18. An electronic device housing according to claim 14, wherein said metallic layer is formed on both the inner and outer surfaces of said case.

19. An electronic device housing according to claim 15 wherein said cover is formed of a synthetic resin and has a metallic layer formed on one side thereof, said metallic layer of said cover being in conductive contact with metallic layer of said case.

20. An electronic device housing according to claim 19, wherein said metallic layers are formed on the case and the cover, said metallic layers being interrupted on portions of said case where an undesired conductive path from said device to said layer may develop.

21. An electronic device housing according to claim 19, wherein said synthetic resin is a polycarbonate or a foamable synthetic resin.

22. An electronic device housing according to claim 14, wherein said cover is a metallic plate.

23. An electronic device housing according to claim 14, wherein said metallic layer is formed by electrodeless metal plating.

24. The electronic device housing of claim 14 wherein said conductive cover is conductively connected to said case by a seal structure including said waterproof seal, said seal structure including, a first channel shaped profile surrounding said access opening of said case and having a concave seal receiving surface and a convex seal depressing surface;

a second channel shaped profile formed about the periphery of said cover and also having a concave seal receiving surface and a convex seal depressing surface;

a conductive electromagnetic shield seal;

a waterproof elastomeric seal;

each said seal being located in the concave seal receiving surface of one of said first and second channel shaped profiles and being depressed by the convex seal depressing surface of the other of said first and second channel shaped profiles.

25. An electronic device housing according to claim 23, wherein said metal plating is performed at an optimum thickness which is about five times the minimum plating thickness which ensures continuous coating of said case.

26. An electronic device housing according to claim 14 wherein the radius of each of said inside corner is not smaller than 0.5 mm.

27. The electronic device housing of claim 14 wherein said housing removably mounts to a mounting bracket having at least two parallel support rails and engaging tabs for securely engaging with said housing when mated thereto in an engaging position; said housing including a pair of parallel guide rails formed in said heat transfer plate and facilitating the location of said housing on said mounting bracket at said engaging position.

28. An electronic device housing according to claim 27 wherein said guide rails are formed by embossing.

29. An electronic device housing according to claim 28 wherein said guide rails comprise a plurality of elliptical or circular lugs.

30. An electronic device housing according to claim 28, wherein said guide rails have a rectilinear crossectional shape.

31. The electronic device housing of claim 27 wherein said heat transfer plate includes a base having first and second downwardly extending edges which form said guide rails.

32. An electronic device housing according to claim 14 wherein a hole commonly provided in said heat transfer plate and case functions as a common dimensional reference point for each.

33. An electronic device housing according to claim 14, wherein said metallic layer is formed by electrocoating a metallic composition having a principal component selected from a group consisting of nickel, copper and silver.

34. An electronic device housing according to claim 14, wherein said metallic layer is formed by electrocoating a metallic composition having a principal component of silver or aluminum.

35. The electronic device housing of claim 14 wherein said metallic layer is formed by metal spraying.

36. An electronic device housing according to claim 14, wherein said cover is formed from an insulating non-conductive material coated on at least one surface thereof with a metallic layer, said cover having beams formed therein.

37. An electronic device housing according to claim 36 wherein a decorative metallic plate is attached to the outer surface of said cover so as to cover said beams.

38. The electronic device housing of claim 16 wherein said cover is a metal plate,
said case having a raised peripheral edge surrounding said access opening and receiving said cover to form a flush top housing surface.

39. The housing of claim 14 wherein said case comprises a molded insert block of a foamable resin incorporating a foamable catalyst,
said case being formed by molding said insert block into the case completed with a synthetic resin of a higher hardness,
said molded insert block having a higher thermal insulation than the remainder of said case.

40. The electronic device housing of claim 39 wherein said molded insert block is cast into the cavity walls surrounding a cavity, said walls having a thickness of about one and a half times the mean thickness of other walls of said case.

41. An electronic device housing according to claim 14, wherein said mounting bracket is provided with a latch for fixably securing said housing to said engaging tabs of said mounting bracket;
said heat radiation plate having a receptacle portion for engagement with a pawl portion of the latch, said receptacle portion being formed by tearing off or by blanking and bending.

42. An electronic device housing according to claim 14, wherein said case has legs projecting from the bottom thereof, while said heat radiation plate has holes for receiving said legs when inserted therethrough.

43. An electronic device housing according to claim 14, wherein said heat radiation plate is of aluminum plate or copper plate.

44. An electronic device housing for containing electronic components including at least one heat generating component comprising:
a case formed of a thermally insulating non-conductive material coated on at least one surface thereof with an electromagnetic shielding coating, said case having a heat transfer opening provided therein on an opening bearing surface thereof;
thermal transfer means, connected to said heat generating component, for conducting heat from said heat generating component through said heat transfer opening to the exterior of said case, said heat transfer means including a heat transfer plate extending across said opening bearing surface of said case and further functioning to provide electromagnetic shielding to said opening bearing surface;
said thermally insulating non-conductive material forming said case insulating said electronic components from environmental temperature variations while said thermal transfer means removes undesired heat from said heat generating component from inside said device housing.

45. The housing of claim 44 wherein said electronic device is a mobile telephone.

46. The housing of claim 45 wherein said insulating non-conductive material is a synthetic resin.

47. The housing of claim 45 further comprising a waterproof seal provided between said case and said cover.

48. The electronic device housing of claim 45 wherein said heat transfer plate including a raised band extending into said heat transfer opening;
said heat generating component being mounted to said heat transfer plate with at least one screw.

49. The electronic device housing of claim 44 further comprising a heat radiation block mounted to said heat transfer plate and positioned for mounting said heat generating component thereto to provide thermal communication therebetween.

50. The electronic device housing of claim 40 wherein said heat radiation block extends through said heat transfer opening.

51. The housing of claim 51 wherein said heat transfer plate generally conforms to the bottom and at least two sides of said case.

52. The electronic device housing of claim 41 wherein said heat transfer plate is formed of a metal plate bent to conform to the bottom and at least two sides of said case.

53. The electronic device housing of claim 47 wherein said case includes an electromagnetic shielding cover covering a case access aperture.

54. The electronic device housing of claim 53 wherein said housing removably mounts to a mounting bracket having at least two parallel support rails and engaging tabs for securely engaging with said housing when mated thereto in an engaging position, said housing including a pair of parallel guide rails formed in said heat transfer plate and facilitating the location of said housing on said mounting bracket at said engaging position.

55. The electrical device housing of claim 45 wherein said heat generating component is mounted to a component subassembly;
said heat transfer opening being sized to allow said component& subassembly to pass through said opening thereby allowing mounting of said subassembly to said heat transfer plate and testing of said subassembly prior to mounting said subassembly in said case.

56. The electronic device housing of claim 55 wherein said heat generating component is a transmitter power amplifier and said subassembly is a transmitter module.

57. The electronic device housing of claim 55 further comprising a metal shield mounted to said heat transfer plate and surrounding said subassembly on at least two sides thereof;
said metal shield when assembled in said housing with said thermal transfer means and said subassembly forming an electromagnetic shielding for said subassembly.

58. An electronic device housing for containing electronic components including at least one heat generating component comprising:
a case formed of a thermally insulating non-conductive material coated on at least one surface thereof with an electromagnetic shielding coating, said case having a heat transfer opening provided therein on an opening bearing surface thereof;
thermal transfer means, connected to said heat generating component, for conducting heat from said heat generating component through said heat transfer opening to the exterior of said case, said heat transfer means including a heat transfer plate inserted into and occupying said opening in said case and further functioning to provide electromagnetic shielding to said opening bearing surface;
said thermally insulating non-conductive material forming said case insulating said electronic components from environmental temperature variations while said thermal transfer means removes undesired heat from said heat generating component from said device housing.

59. The electronic device housing of claim 58 wherein said heat transfer plate has radiation fine cast thereon.

60. A housing for an electronic device having a first circuit with an operating parameter affected by variations in temperature and a second circuit developing undesired heat to be removed therefrom, said housing comprising:
a case formed of a relatively thermally non-conductive material having at least first and second cavities separated by a thermally insulated wall for receiving said first and second circuits respectively, said case having a heat transfer opening between said second cavity and the exterior of said case;
a thermal transfer plate, connected to said heat generating component when received in said second cavity, for conducting heat from said heat generating component through said opening to the exterior of said case;
said thermally insulated wall between said first and second cavities and said thermal transfer plate collectively preventing the heat generated by said heat generating device from adversely affecting the operating parameter of said first circuit.

61. The housing of claim 60 wherein said case fully encloses said first and second cavities and includes means for electrically isolating said first and second circuits from electromagnetic radiation developed both exterior said case and interior said case but outside each circuit's respective cavity.

62. The housing of claim 60 wherein said case is formed of a plastic material coated with an electrically conductive coating, said means for isolating forming said coating.

63. The housing of claim 62 wherein said first circuit includes a temperature sensitive crystal oscillator.

64. The housing of claim 63 wherein said second circuit includes a transmitter power amplifier.

65. The housing of claim 64 wherein said electronic device is a mobile telephone.

66. The housing of claim 65 wherein said case comprises a container having at least a bottom and sides and a cover.

67. The housing of claim 60 wherein said container is formed of a thermally insulative plastic material having an electromagnetic shield coating formed thereon.

68. The housing of claim 67 wherein said cover is also formed of a thermally insulative plastic material having an electromagnetic shield coating formed thereon.

69. An electronic device housing according to claim 62 wherein said case is formed by molding using a heat-resistant ABS resin.

70. A housing for an electronic device having a component with an operating parameter adversely affected by temperature variations, said housing comprising:
a case formed of a synthetic resin and including,
a relatively high density resin forming said case, and
a relatively low density thermally insulative resin core surrounding said component and embedded in said relatively high density resin;
said relative low density resin core insulating said component from environmental temperature swings.

71. The housing of claim 70 wherein said electronic device is a mobile telephone.

72. The housing of claim 71 in said case includes an access aperture and a cover covering said access aperture.

73. The housing of claim 72 further comprising a waterproof seal provided between said case and said cover.

74. The electronic device housing of claim 73 wherein said conductive cover is conductively connected to said case by a seal structure including said waterproof seal, said seal structure including,
a first channel shaped profile surrounding said access opening of said case and having a concave seal receiving surface and a convex seal depressing surface;
a second channel shaped profile formed about the periphery of said cover and also having a concave seal receiving surface and a convex seal depressing surface;
a conductive electromagnetic shield seal;

a waterproof elastomeric seal;

each said seal being located in the concave seal receiving surface of one of said first and second channel shaped profiles and being depressed by the convex seal depressing surface of the other of said first and second channel shaped profiles.

75. The housing of claim 71 wherein said relatively low density resin case is a separately molded insert molded into said relatively high density resin.

76. The electronic device housing of claim 75 wherein said molded insert block is cast into the cavity walls surrounding a cavity, said walls having a thickness of about one and a half times the mean thickness of other walls of said case.

77. The housing of claim 71 wherein said relatively low density resin core and said relatively high density resin forming said case are molded in a single molding step.

78. The housing of claim 71 wherein reaction injection molding or structural foam molding is used to form said case.

* * * * *